US009196721B2

(12) United States Patent
Saito et al.

(10) Patent No.: US 9,196,721 B2
(45) Date of Patent: Nov. 24, 2015

(54) SEMICONDUCTOR DEVICE

(71) Applicant: KABUSHIKI KAISHA TOSHIBA, Tokyo (JP)

(72) Inventors: Wataru Saito, Kawasaki Kangawa (JP); Syotaro Ono, Tatsuno Hyogo (JP); Toshiyuki Naka, Yokohama Kanagawa (JP); Shunji Taniuchi, Nomi Ishikawa (JP); Miho Watanabe, Sendai Miyagi (JP); Hiroaki Yamashita, Himeji Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/329,413

(22) Filed: Jul. 11, 2014

(65) Prior Publication Data

US 2014/0319599 A1 Oct. 30, 2014

Related U.S. Application Data

(62) Division of application No. 13/357,381, filed on Jan. 24, 2012, now Pat. No. 8,816,410.

(30) Foreign Application Priority Data

Jan. 26, 2011 (JP) ................................. 2011-014503

(51) Int. Cl.
*H01L 29/78* (2006.01)
*H01L 29/08* (2006.01)
(Continued)

(52) U.S. Cl.
CPC ........ *H01L 29/7811* (2013.01); *H01L 29/0865* (2013.01); *H01L 29/1095* (2013.01);
(Continued)

(58) Field of Classification Search
CPC ............ H01L 29/0696; H01L 29/1095; H01L 29/0634; H01L 29/7811; H01L 29/0619; H01L 29/7802
USPC .......... 257/262, 368–401, E29.255–E29.313, 257/E29.315–E29.316; 438/135, 151, 197, 438/199, 201, 207, 216
See application file for complete search history.

(56) References Cited

U.S. PATENT DOCUMENTS 6,849,880 B1 2/2005 Saito et al.
6,930,352 B2 8/2005 Saito et al.
(Continued)

FOREIGN PATENT DOCUMENTS

JP 2004006598 A 1/2004
JP 2010041049 A 2/2010

OTHER PUBLICATIONS

Japanese Office Action dated Mar. 6, 2014, filed in Japanese counterpart Application No. 2011-014503, 4 pages (with translation).
(Continued)

*Primary Examiner* — David Vu
*Assistant Examiner* — Jonathan Han
(74) *Attorney, Agent, or Firm* — Patterson & Sheridan, LLP

(57) ABSTRACT

A first semiconductor device of an embodiment includes a first semiconductor layer of a first conductivity type, a first control electrode, an extraction electrode, a second control electrode, and a third control electrode. The first control electrode faces a second semiconductor layer of the first conductivity type, a third semiconductor layer of a second conductivity type, and a fourth semiconductor layer of a first conductivity type, via a first insulating film. The second control electrode and the third control electrode are electrically connected to the extraction electrode, and face the second semiconductor layer under the extraction electrode, via the second insulating film. At least a part of the second control electrode and the whole of the third control electrode are provided under the extraction electrode. The electrical resistance of the second control electrode is higher than the electrical resistance of the third control electrode.

4 Claims, 20 Drawing Sheets

(51) Int. Cl.

| | |
|---|---|
| ***H01L 29/10*** | (2006.01) |
| *H01L 29/06* | (2006.01) |
| *H01L 29/423* | (2006.01) |

(52) U.S. Cl.

CPC ...... *H01L29/4238* (2013.01); *H01L 29/42372* (2013.01); *H01L 29/0619* (2013.01); *H01L 29/0634* (2013.01); *H01L 29/0878* (2013.01); *H01L 29/42368* (2013.01)

(56) References Cited

U.S. PATENT DOCUMENTS

2002/0185705 A1* 12/2002 Saitoh et al. .................. 257/492
2003/0209741 A1 11/2003 Saitoh et al.
2008/0315297 A1* 12/2008 Takashita et al. ............. 257/328
2009/0008708 A1 1/2009 Arai et al.
2009/0090968 A1 4/2009 Ono et al.
2010/0123186 A1* 5/2010 Ohta et al. .................... 257/329
2010/0230745 A1 9/2010 Saito et al.
2010/0264489 A1* 10/2010 Ohta et al. .................... 257/334

OTHER PUBLICATIONS

Chinese Office Action dated Dec. 27, 2013, filed in Chinese counterpart Application No. 201210017576.X, 11 pages (with translation).
Chinese Office Action dated Sep. 2, 2014, filed in Chinese counterpart Application No. 201210017576.X, 13 pages (with translation).

* cited by examiner 31
30
63
62
43
100
30
61
30
31
400
13
12
13
Cgd
11
10
60
12a
12
90
91
90

60
D
100
Cgd
43
31
Rg
Cds
G.P.
G
S
63

Z-Z'
1A
43
41A
40
11
10
60

Y-Y'
1A
31a
42A
40
41B
43
42A
31a
11
10
60

X-X'
1A
31
30
63
61
11
10
60
12
13

31a
42A
43
1J
31a
42A
41S 31a
42A
41
41Sb
41Sa
43
1J
31a
42A
41S

SEMICONDUCTOR DEVICE

CROSS-REFERENCE TO RELATED APPLICATION

This application is a division of U.S. patent application Ser. No. 13/357,381, filed on Jan. 24, 2012, which is based upon and claims the benefit of priority from the prior Japanese Patent Application No. 2011-014503, filed on Jan. 26, 2011; the entire contents of each of which are incorporated herein by reference.

FIELD

Embodiments described herein relate generally to a semiconductor device.

BACKGROUND

For downsizing of power supply circuits such as a switching power supply, it is effective to increase the switching frequency and reduce the size of passive devices such as inductance and capacitance in power supply circuits. However, the increase in the switching frequency leads to increasing switching loss of switching devices such as a MOSFET (Metal Oxide Semiconductor Field Effect Transistor), an IGBT (Insulated Gate Bipolar Transistor), or the like, and decreasing power supply efficiency of the switching power supply. Accordingly, for downsizing of power supply circuits such as a switching power supply, it is essential to reduce switching loss while increasing the speed of the switching device.

In MOS gate devices such as a MOSFET, an IGBT, or the like used as a switching device, gate capacitance is reduced by shortening the gate length, thereby the speed being able to be increased. However, reducing the gate capacitance to increase the speed causes resonance between the parasitic inductance included in the wiring and the switching device capacitance. Accordingly, high-frequency noise is generated from the MOS gate device at the time of switching.

As an example for solving the above problem, there is a structure having a $p^-$-type layer provided under a gate electrode of a MOS gate device. Such a structure increases the gate-drain capacitance when a high voltage is applied, whereby temporal variation of the drain voltage (dV/dt) is reduced. Accordingly, switching noise is reduced. However, the manufacturing process of forming a $p^-$-type layer under the gate electrode is complicated. Therefore, a lower limit is caused for cost reduction of MOS gate devices.

BRIEF DESCRIPTION OF THE DRAWINGS

FIG. 15A corresponds to the cross-section taken along X-X' of FIG. 13, FIG. 15B corresponds to the cross-section taken along Y-Y' of FIG. 13, and FIG. 15C corresponds to the cross-sectional view taken along Z-Z' of FIG. 13;

DETAILED DESCRIPTION

Figure 1:
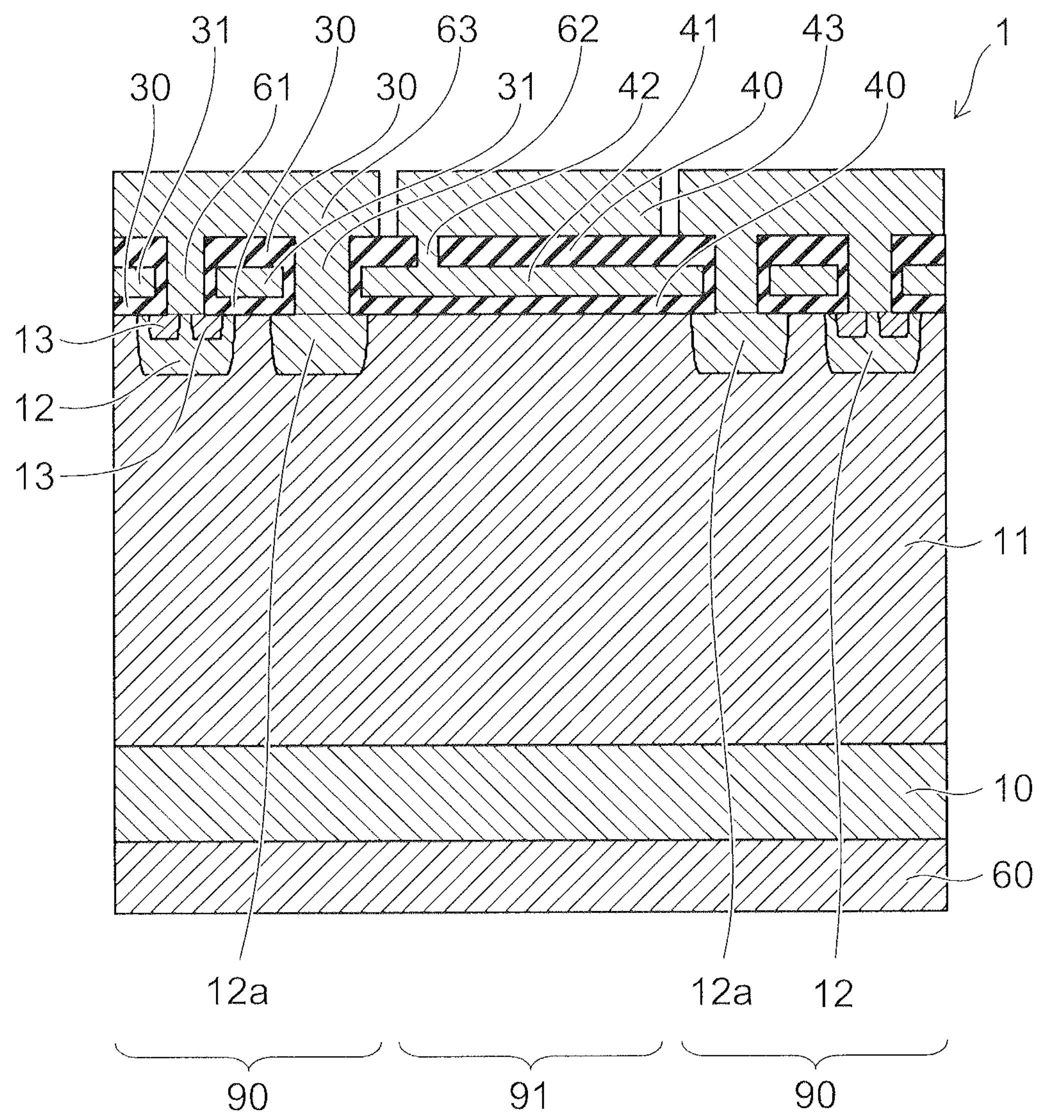
FIG. 1 is a cross-section of a semiconductor device 1 according to an embodiment.

A first semiconductor device of an embodiment includes a first semiconductor layer of a first conductivity type, a second semiconductor layer of the first conductivity type, a third semiconductor layer of a second conductivity type, a fourth semiconductor layer of a first conductivity type, a first control electrode, an extraction electrode, a second control electrode, a third control electrode, a first main electrode, and a second main electrode. The second semiconductor layer is provided on the first semiconductor layer. The third semiconductor layer is selectively provided on a surface of the second semiconductor layer. The fourth semiconductor layer is selectively provided on a surface of the third semiconductor layer. The first control electrode faces the second semiconductor layer, the third semiconductor layer, and the fourth semiconductor layer, via a first insulating film. The extraction electrode is electrically connected to the first control electrode and provided on the second semiconductor layer of a second region which is different from a first region having the first control electrode provided therein. The second control electrode and the third control electrode are electrically connected to the extraction electrode, and face the second semiconductor layer under the extraction electrode, via the second insulating film. The first main electrode is connected to the first semiconductor layer. The second main electrode is connected to the third semiconductor layer and the fourth semiconductor layer. The third semiconductor layer is not provided on the surface of the second semiconductor layer under the extraction electrode, but at least a part of the second control electrode and the whole of the third control electrode are provided under the extraction electrode. The electrical resistance of the second control electrode is higher than the electrical resistance of the third control electrode.

Embodiments of the invention will now be described with reference to the drawings. In the specification and the drawings of the application, components similar to those described in regard to a drawing thereinabove are marked with like reference numerals, and a detailed description is omitted as appropriate.

Outline of Embodiments

FIG. 1 is an explanatory drawing of the outline of a semiconductor device according to an embodiment. FIG. 1 shows a cross-section of a semiconductor device 1 according to the embodiment. In the semiconductor device 1, cell units including a device region 90 and a gate pad region 91 shown in FIG. 1 are arranged periodically. The device region 90 may be denoted as a first region and the gate pad region 91 may be denoted as a second region.

The semiconductor device 1 is provided with a MOSFET having a top-and-bottom electrode structure. In the semiconductor device 1, an n-type drift layer 11 serving as the second semiconductor layer is provided on an $n^+$-type drain layer 10 serving as the first semiconductor layer.

In a device region 90 corresponding to device central part of the semiconductor device 1, a p-type base layer 12 serving as the third semiconductor layer is selectively provided on the surface of the n-type drift layer 11. An $n^+$-type source layer 13 serving as the fourth semiconductor layer is selectively provided on the surface of the p-type base layer 12. Around the outermost circumference of the device region 90, a $p^-$-type layer 12*a* is provided on the surface of the n-type drift layer 11. The first gate insulating film 30 serving as the first insulating film is provided on the n-type drift layer 11, the p-type base layer 12, the $n^+$-type source layer 13, and the $p^-$-type layer 12*a*.

Additionally, in a direction approximately parallel to the major surface of the $n^+$-type drain layer 10, a first gate electrode 31 serving as the first control electrode is provided, ranging from a part of the $n^+$-type source layer 13, via the p-type base layer 12 adjacent to the part, to a part of the n-type drift layer 11. The first gate insulating film 30 is provided between the first gate electrode 31, and the $n^+$-type source layer 13, the p-type base layer 12 and the n-type drift layer 11. That is, the first gate electrode 31 faces the n-type drift layer 11, the p-type base layer 12, and the $n^+$-type source layer 13, via the first gate insulating film 30.

The $n^+$-type drain layer 10 has a drain electrode 60 serving as the first main electrode connected thereto. The $n^+$-type source layer 13 and the p-type base layer 12 have a contact layer 61 connected thereto. The $p^-$-type layer 12*a* has a contact layer 62 connected thereto. The contact layers 61 and 62 have a source electrode 63 serving as the second main electrode connected thereto. That is, the source electrode 63 is electrically connected to the $n^+$-type source layer 13 and the p-type base layer 12, via the contact layers 61 and 62. The first gate insulating film 30 is provided between the source electrode 63 and the contact layers 61, 62, and the first gate electrode 31.

Additionally, in a gate pad region 91, the second gate insulating film 40 serving as the second insulating film is provided on the n-type drift layer 11 and the $p^-$-type layer 12*a*. Furthermore, a gate electrode 41 including the second control electrode and the third control electrode is provided in a direction approximately parallel to the major surface of the $n^+$-type drain layer 10. As will be described below, at least a part of the second control electrode and the whole of the third control electrode are provided under a gate pad electrode 43. The gate electrode 41 is provided between the gate pad electrode 43 and the n-type drift layer 11, via the second gate insulating film 40. The gate electrode 41 is provided under the gate pad electrode 43. The gate electrode 41 faces the drain electrode 60 via the second gate insulating film 40.

The gate electrode 41 has a contact layer 42 connected thereto. The contact layer 42 has the gate pad electrode 43 connected thereto. The second gate insulating film 40 is provided between the gate pad electrode 43, and the gate electrode 41 and the contact layer 42.

The gate pad electrode 43 is provided on the n-type drift layer 11 outside the device region 90 having the first gate electrode 31 provided therein. The gate pad electrode 43 is provided on the n-type drift layer 11 in a region different from the region having the first gate electrode 31 provided therein. The gate pad electrode 43 is, for example, an extraction electrode for extracting the first gate electrode 31 to the outside of the semiconductor device 1. The p-type base layer 12 is not provided under the gate pad electrode 43. That is, the gate electrode 41 is in contact with the n-type drift layer 11 via the second gate insulating film 40.

In the semiconductor device 1, the gate pad electrode 43 is electrically connected to the first gate electrode 31. The gate electrode 41 is electrically connected to the gate pad electrode 43.

By such a structure, capacitance between the gate and the drain of the semiconductor device 1 increases, thereby switching noise being suppressed.

The respective main components of the $n^+$-type drain layer 10, the n-type drift layer 11, the p-type base layer 12, the $n^+$-type source layer 13, and the $p^-$-type layer 12*a* are based on silicon (Si), for example.

The main component of the first gate insulating film 30 is silicon oxide ($SiO_2$), for example. The main component of the second gate insulating film 40 is silicon oxide ($SiO_2$), silicon nitride ($Si_3N_4$), or the like, for example.

The main component of the first gate electrode 31 and the gate electrode 41 is polysilicon, for example.

The main component of the drain electrode 60, the source electrode 63, the contact layers 42, 61 and 62 is a conductive material such as copper (Cu), tungsten (W), aluminum (Al), polysilicon having impurities doped therein, or the like, for example.

Subsequently, an effect of the semiconductor device 1 will be explained.

Before explaining the effect of the semiconductor device 1, a semiconductor device 100 according to a reference example will be explained.

Figure 2A:
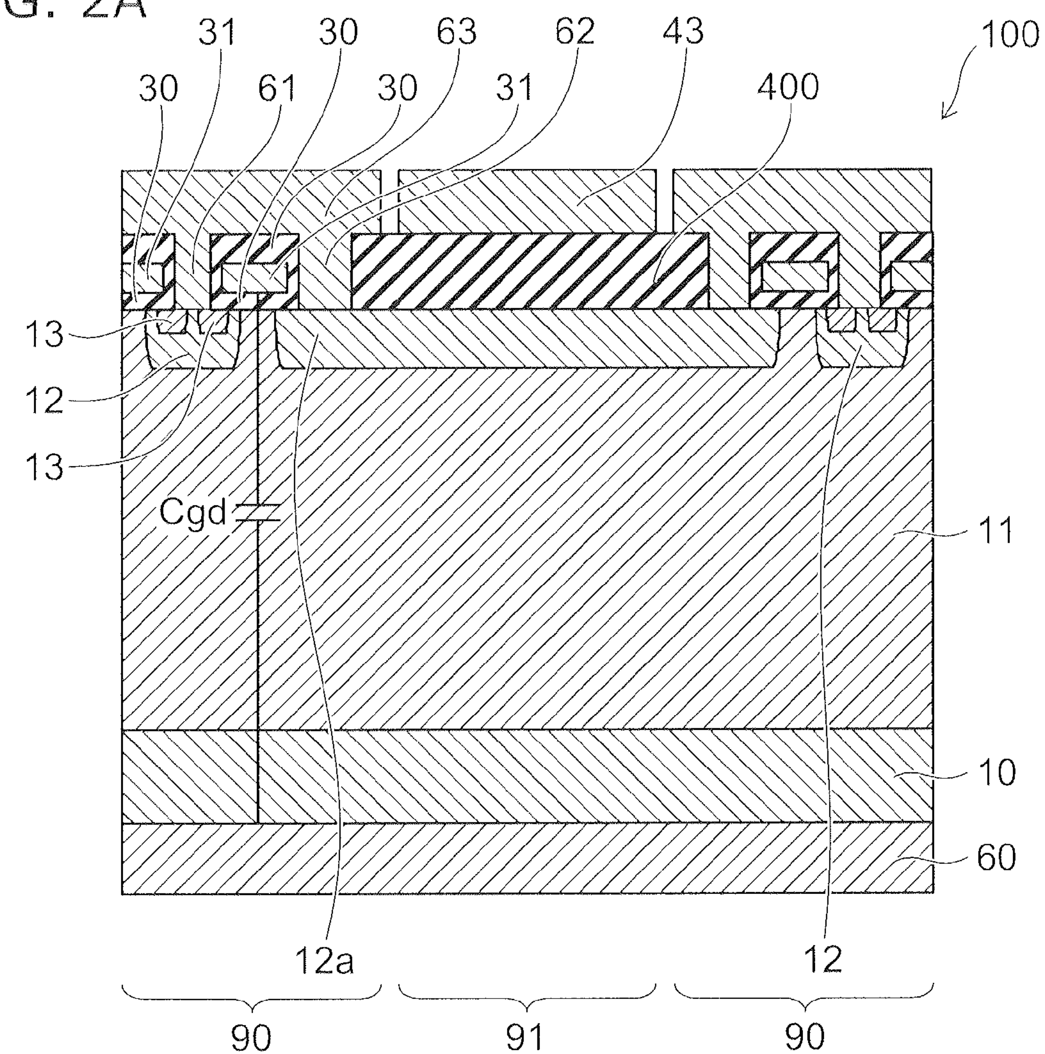
FIG. 2A is a cross-sectional view of the major part of a semiconductor device according to a reference example.
Figure 2B:
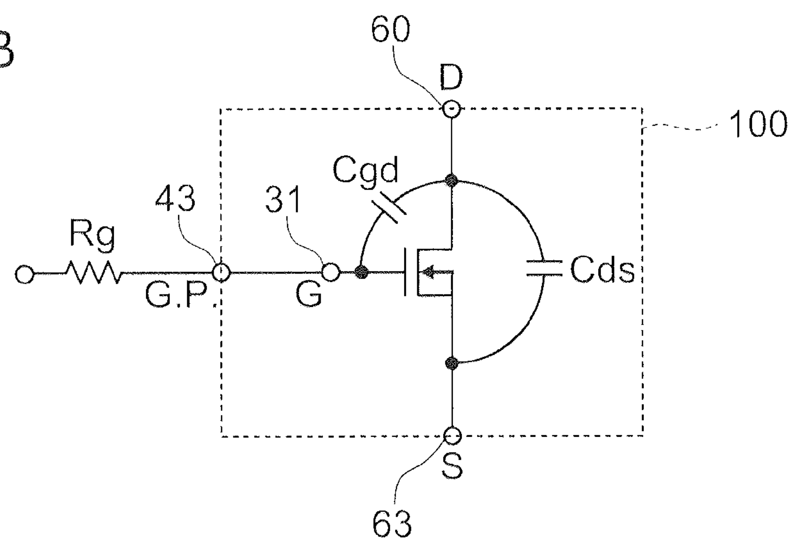
FIG. 2B is an equivalent circuit diagram of the semiconductor device according to the reference example.

FIG. 2 is an explanatory drawing of a semiconductor device according to the reference example, in which FIG. 2A is a cross-sectional view of the major part of the semiconductor device according to the reference example, and FIG. 2B is an equivalent circuit diagram of the semiconductor device according to the reference example.

The semiconductor device 100 according to the reference example is not provided with the gate electrode 41 described above. On the semiconductor device 100, the gate pad electrode 43 is arranged on the gate pad region 91. The gate pad electrode 43 is electrically connected to the first gate electrode 31. An insulating film 400 is provided between the gate pad electrode 43 and the n-type drift layer 11. Furthermore, a $p^-$-type layer 110 is provided under the gate pad electrode 43. The structure of the semiconductor device 100 other than the device described above is the same as the structure of the semiconductor device 1.

FIG. 2B shows the connection relation of a source electrode 63 (S), a drain electrode 60 (D), a first gate electrode 31 (G), and a gate pad electrode 43 (G.P.) of the semiconductor device 100. The gate pad electrode 43 has an external gate resistance Rg connected thereto. The external gate resistance Rg is, for example, a resistance for adjusting the charge/discharge time between the gate and the drain. For example, the higher the external gate resistance Rg is set, the longer the charge/discharge time between the gate and the drain can be made.

In response to downsizing of semiconductor devices, the gate length tends to be much shorter. Accordingly, the facing area between the gate electrode and the drain electrode becomes smaller, thereby the gate-drain capacitance (Cgd) being reduced. Along with downsizing of semiconductor devices, switching speed has thus become faster.

However, if the gate-drain capacitance (Cgd) becomes too small in comparison with the drain-source capacitance (Cds), switching time is determined by the charge/discharge time between the drain and the source, thereby the gate controllability at the time of switching being degraded. Accordingly, switching noise from the semiconductor device 100 becomes easily generated. For example, it becomes impossible to control the temporal variation (dVds/dt) of the drain-source voltage (Vds: Voltage between the drain and the source) with internal gate resistance.

In addition, if the gate-drain capacitance (Cgd) becomes significantly small and switching becomes very fast, there may be case where resonance is generated between the parasitic inductance included in the wiring outside the device and the switching device capacitance such as between the gate and the source, between the gate and the drain, between the drain and the source, or the like. As a result, high-frequency noise may be generated from the semiconductor device 100 at the time of switching.

An approach of setting the charge/discharge time between the gate and the drain longer by the adjustment of the external gate resistance Rg, and of suppressing high-frequency noise can also be considered. However, simply adjusting the external gate resistance Rg has a limit in gate controllability if the gate-drain capacitance (Cgd) becomes too small.

Figure 3A:
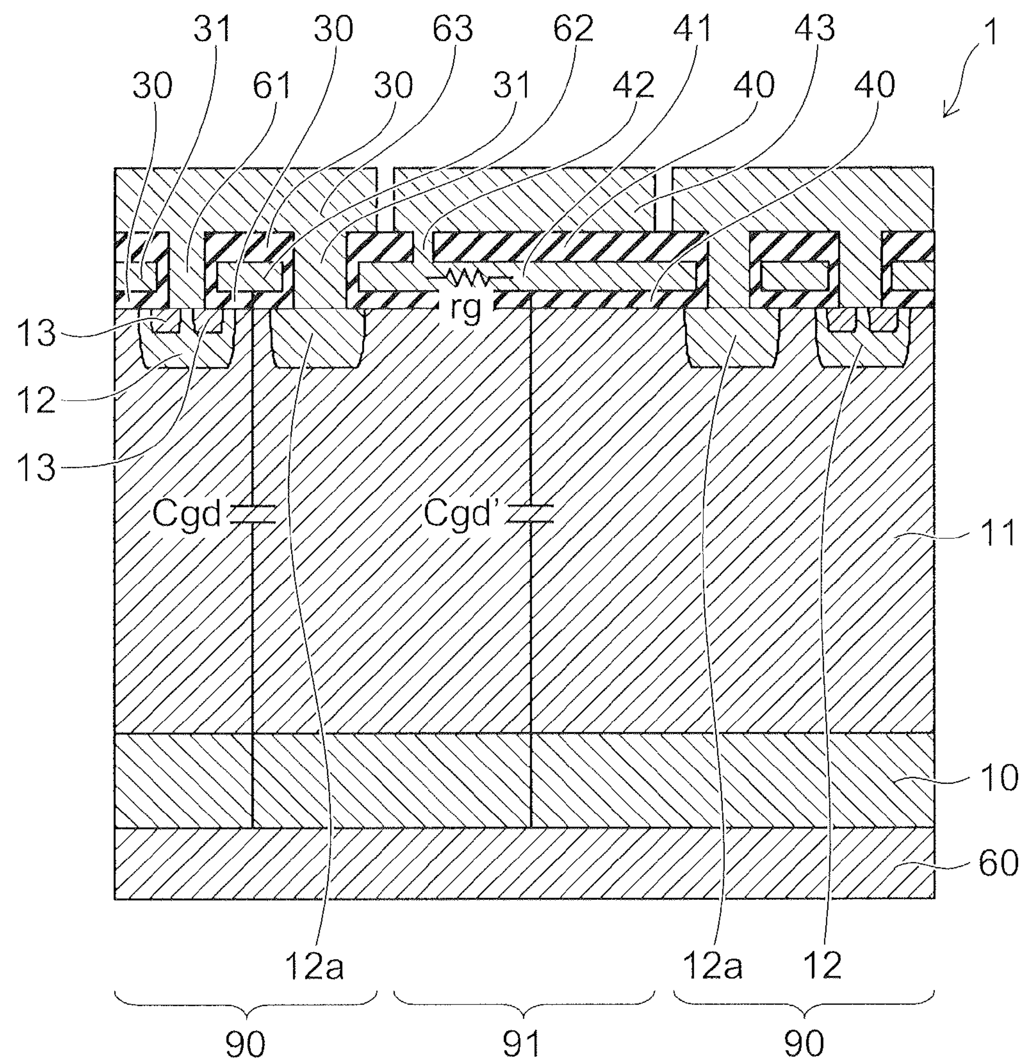
FIG. 3A is a cross-sectional view of the major part of a semiconductor device according to the embodiment.
Figure 3B:
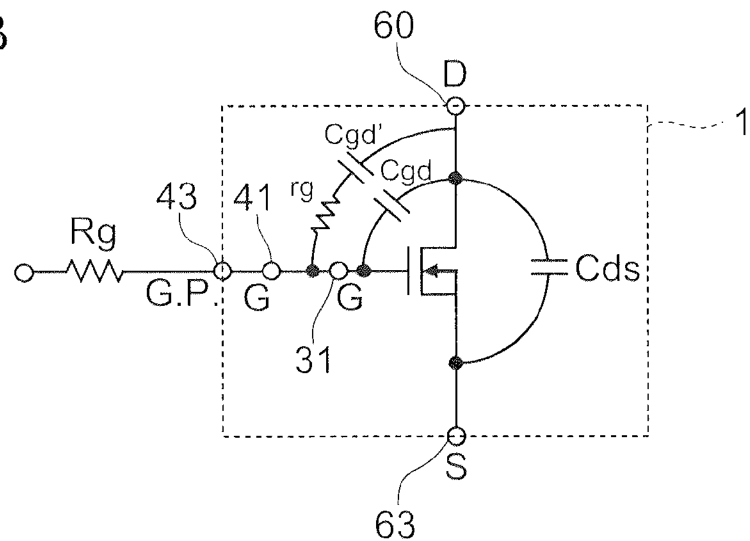
FIG. 3B is an equivalent circuit diagram of the semiconductor device according to the embodiment.

FIG. 3 is an explanatory drawing of an effect of the semiconductor device according to the embodiment, in which FIG. 3A is a cross-sectional view of the major part of the semiconductor device according to the embodiment, and FIG. 3B is an equivalent circuit diagram of the semiconductor device according to the embodiment.

In the semiconductor device 1, the gate electrode 41 is provided under the gate pad electrode 43, besides the first gate electrode 31. The second gate insulating film 40 is provided between the gate electrode 41 and the drain electrode 60. Alternatively, a depletion layer is formed on the semiconductor layer between the gate electrode 41 and the drain electrode 60. Therefore, in the semiconductor device 1, a capacitance between the gate and the drain (Cgd'), besides the gate-drain capacitance (Cgd), is generated between the gate pad electrode 43 and the drain electrode 60.

Additionally, in the semiconductor device 1, a high internal gate resistance is generated by electrically connecting the gate electrode 41 having a plane pattern and the gate pad electrode 43 having a plane pattern. For example, the gate pad electrode 43 and the gate electrode 41 are not brought into contact in the entire region in which they face each other. The gate pad electrode 43 and the gate electrode 41 are electrically connected via the thin contact layer 42.

The gate electrode 41 includes the second control electrode and the third control electrode. At least a part of the second control electrode and the whole of the third control electrode are provided under the gate pad electrode 43. The electrical resistance of the second control electrode may be set higher than the electrical resistance of the third control electrode. For example, the line width of the second control electrode is made smaller than the width of the third control electrode. Accordingly, a high internal gate resistance rg is generated in the gate electrode 41.

In this way, in the semiconductor device 1, an internal gate resistance rg corresponding to the addition of the gate electrode 41 and the gate-drain capacitance (Cgd') connected to the internal gate resistance rg are added between the gate pad electrode 43 and the drain electrode 60, besides the gate-drain capacitance (Cgd). Because of this, the time constant between the gate and the drain of the semiconductor device 1 becomes larger than in the case of the semiconductor device 100. As a result, switching noise of the semiconductor device 1 is suppressed in comparison with the case of the semiconductor device 100.

In addition, according to the semiconductor device 1, capacitance between the gate and the drain increases without increasing the period of the first gate electrode 31. Therefore, in the semiconductor device 1, the channel density per unit area in the device region 90 does not decrease and the ON-resistance per unit area does not increase. Furthermore, the gate electrode 41 is disposed under the gate pad electrode 43. Therefore, the device area of the semiconductor device 1 does not increase.

With regard to the gate-drain capacitance (Cgd') under the gate pad electrode 43, the Cgd' can be adjusted as appropriate by changing the contact area between the gate electrode 41 and the second gate insulating film 40. Therefore, design flexibility of the gate-drain capacitance in the semiconductor device 1 increases in comparison with the case of semiconductor device 100.

Additionally, in the semiconductor device 1, the manufacturing process of forming a $p^-$-type layer under the gate electrode described above is not required. The patterning of the gate electrode 41 can be performed in the same manufacturing process as the patterning of first gate electrode 31. For example, the first gate electrode 31 and the gate electrode 41 can be manufactured in the same manufacturing process by using a mask having both the pattern shape of the first gate electrode 31 and the pattern shape of the gate electrode 41. Because of this, the manufacturing process of the semiconductor device 1 is simplified, thereby reducing the manufacturing cost.

In addition, the sheet resistance of the gate electrode 41 of the gate pad region 91 may be set higher than the sheet resistance of the first gate electrode 31 of the device region 90 (Ω/square). Because of this, it is also possible to further increase the internal gate resistance rg. For example, when the material of the first gate electrode 31 and the gate electrode 41 is polysilicon, their sheet resistances can be made different by changing their impurity concentrations.

In this way, the semiconductor device 1 has a high reliability and can be realized with a low cost.

Subsequently, a specific example of the planar shape of the gate electrode 41 will be explained.

First Specific Example

Figure 4:
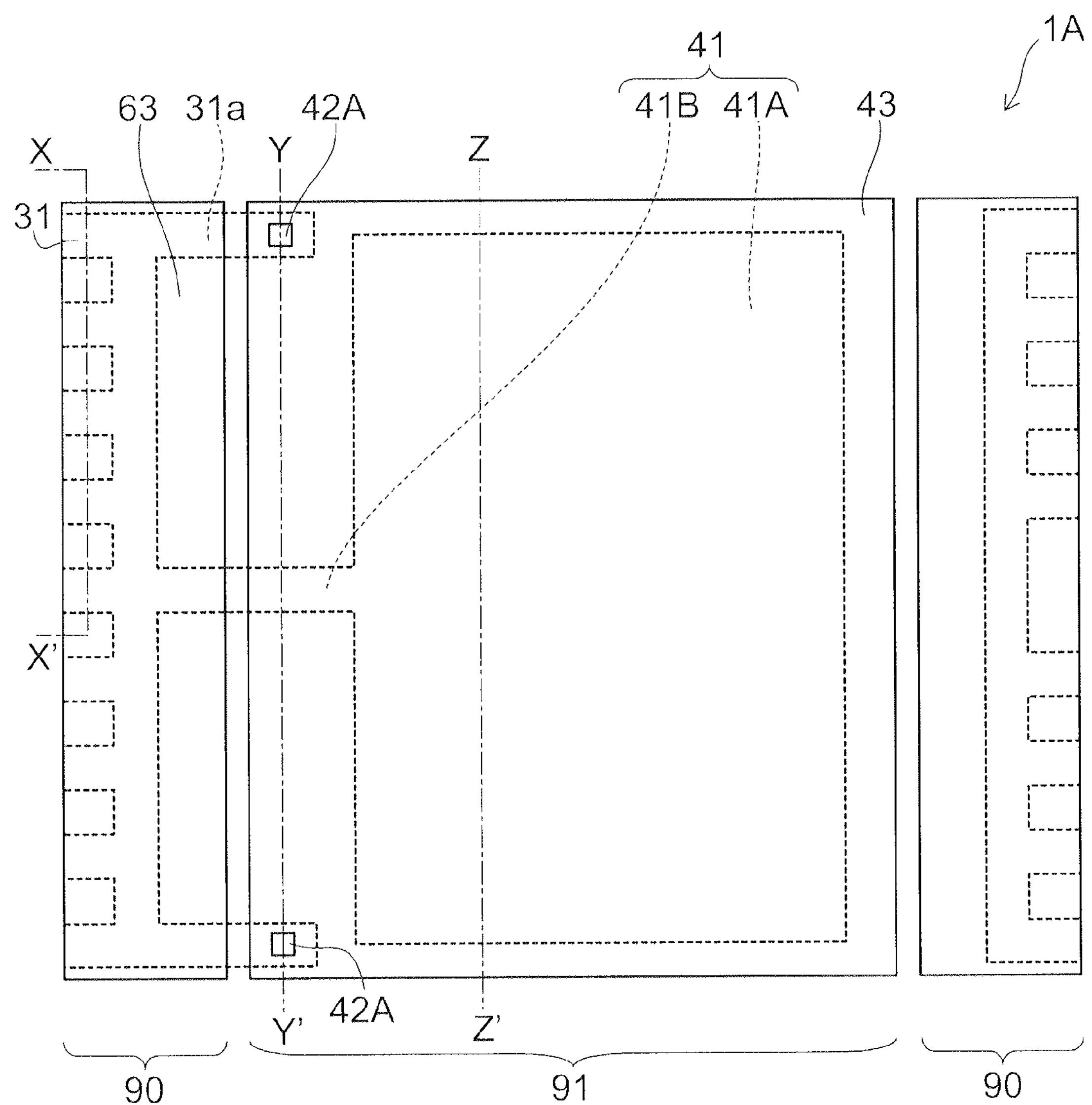
FIG. 4 is a plan view of the major part of a semiconductor device according to the first specific example.

FIG. 4 is a plan view of the major part of the semiconductor device according to a first specific example.

Figures 5A, 5B, 5C:
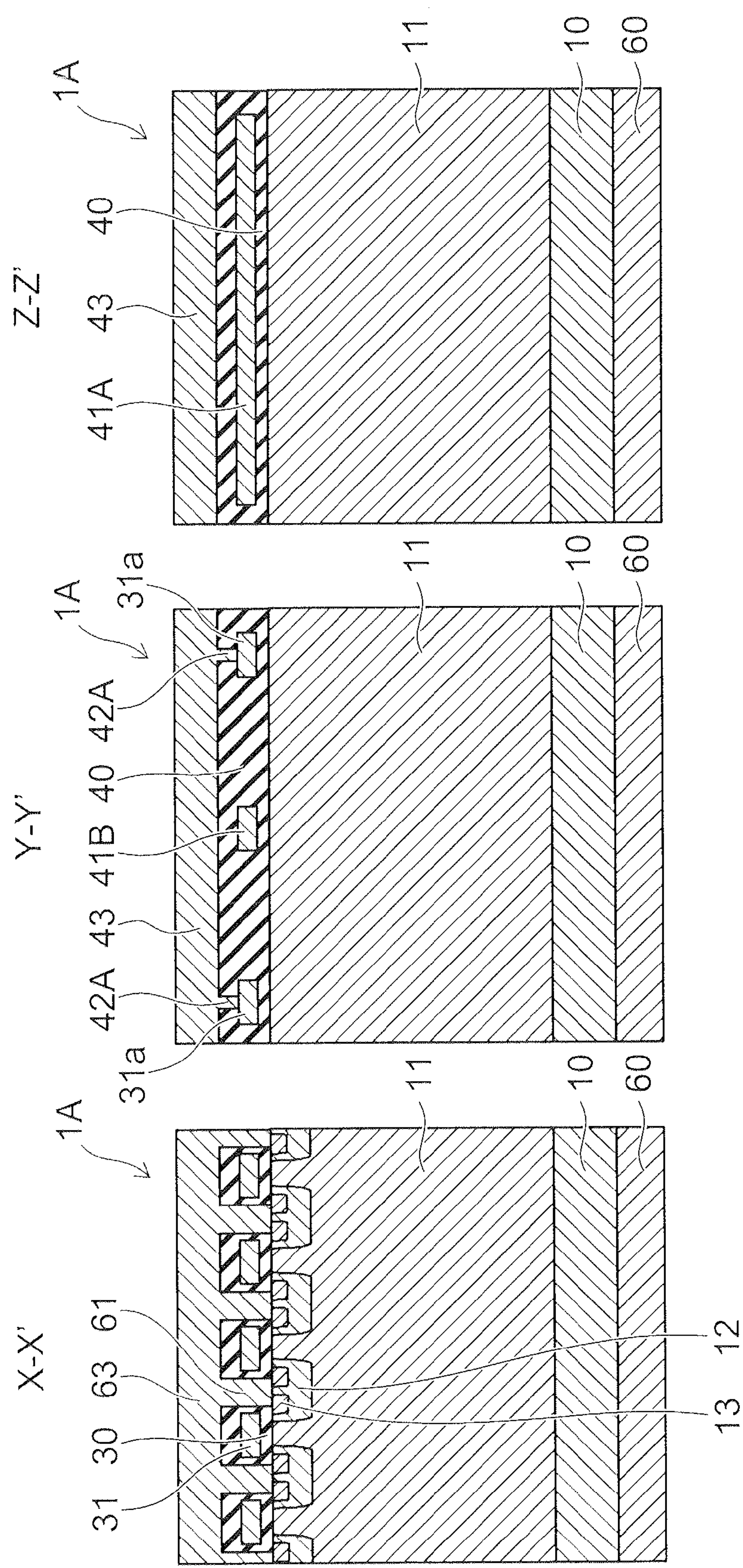
FIG. 5A is a cross-sectional view taken along X-X' of FIG. 4.
FIG. 5B is a cross-sectional view taken along Y-Y' FIG. 4.
FIG. 5C is a a cross-sectional view taken along Z-Z' of FIG. 4.

FIG. 5 is a cross-sectional view of the major part of the semiconductor device according to the first specific example, in which FIG. 5A is a cross-sectional view taken along X-X' of FIG. 4, FIG. 5B is a cross-sectional view taken along Y-Y' FIG. 4, and FIG. 5C is a a cross-sectional view taken along Z-Z' of FIG. 4.

In the semiconductor device 1A according to the first specific example, the gate electrode 41 includes a second gate electrode 41B serving as the second control electrode and a third gate electrode 41A serving as the third control electrode. At least a part of the second gate electrode 41B and the whole of the third gate electrode 41A are provided under the gate pad electrode 43. When viewed from a direction perpendicular to the major surface of the $n^+$-type drain layer 10, the planar shape of the third gate electrode 41A is rectangular. The shape of the second gate electrode 41B is linear. That is, the second gate electrode 41B is thinner than the third gate electrode 41A. For example, in a direction along which the first gate electrodes 31 are arranged periodically, the width of the second gate electrode 41B is smaller than the width of the third gate electrode part 41A. Because of this, the electrical resistance of the second gate electrode 41B becomes higher than the electrical resistance of the third gate electrode 41A.

In the semiconductor device 1A, the gate pad electrode 43 is connected to a joint 31*a* of the first gate electrode 31, via the contact layer 42A. The joint 31*a* is a part of the first gate electrode 31. The first gate electrode 31 has the second gate electrode 41B connected thereto.

In this way, in the semiconductor device 1A, the gate electrode 41 is provided under the gate pad electrode 43, besides the first gate electrode 31. The second gate insulating film 40 is provided between the gate electrode 41 and the drain electrode 60. Therefore, in the semiconductor device 1A, the gate-drain capacitance (Cgd') is generated between the gate pad electrode 43 and the drain electrode 60, besides the gate-drain capacitance (Cgd).

The gate pad electrode 43 and the gate electrode 41 do not contact each other in the entire region in which they face each other, but are electrically connected via the contact layer 42A provided in a part of the gate pad region 91. In addition, the gate electrode 41 includes the thin second gate electrode part 41B. Because of this, a high internal gate resistance rg is generated in the gate electrode 41.

Therefore, the time constant between the gate and the drain of the semiconductor device 1A becomes larger than in the case of the semiconductor device 100. As a result, switching noise of the semiconductor device 1A is suppressed in comparison with the case of the semiconductor device 100.

The position of the contact layer does not have to be limited to a corner of the gate pad region 91. A specific example will be shown next.

First Variation of First Specific Example

Figure 6:
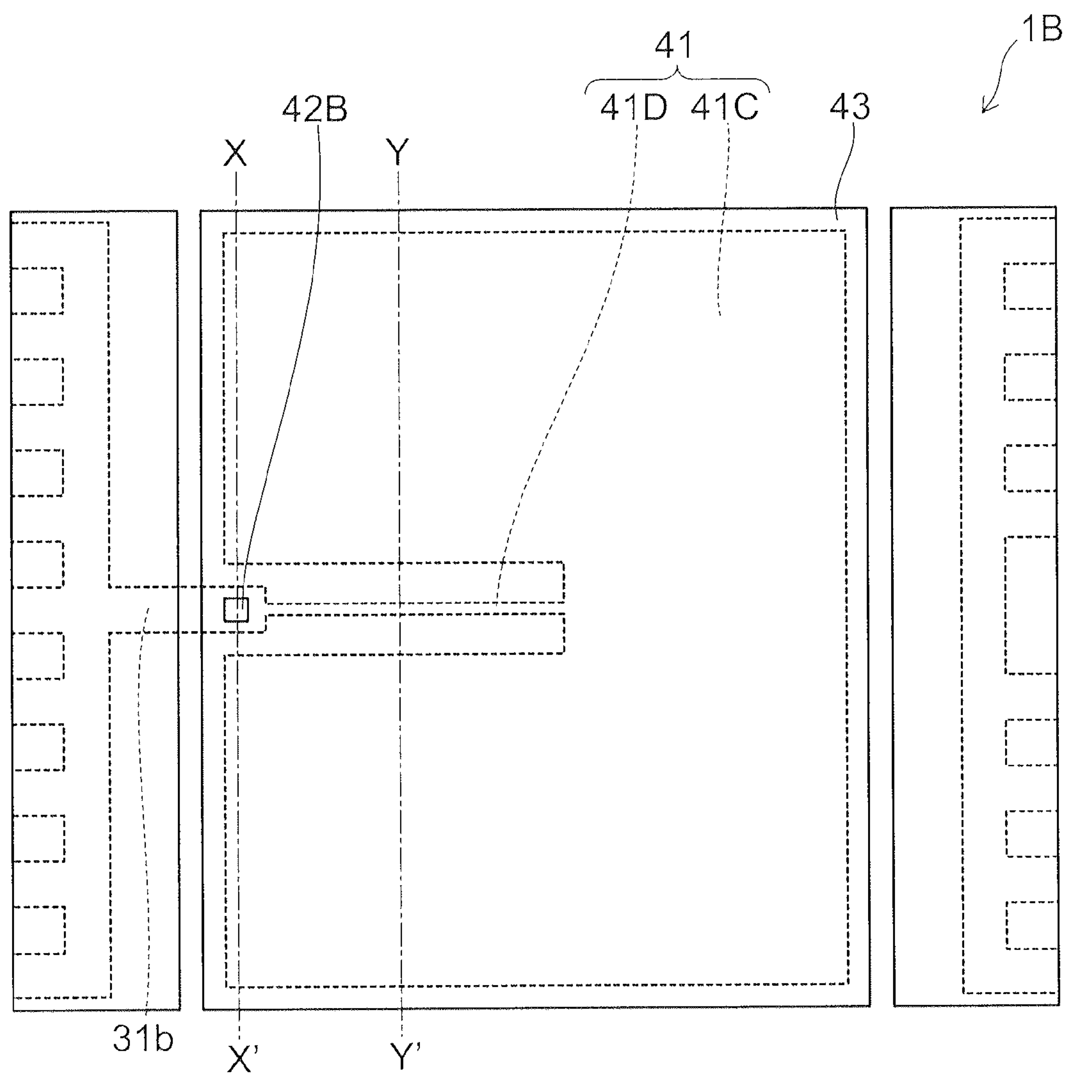
FIG. 6 is a plan view of the major part of a semiconductor device according to the first variation of the first specific example.

FIG. 6 is a plan view of the major part of the semiconductor device according to the first variation of the first specific example.

Figure 7B:
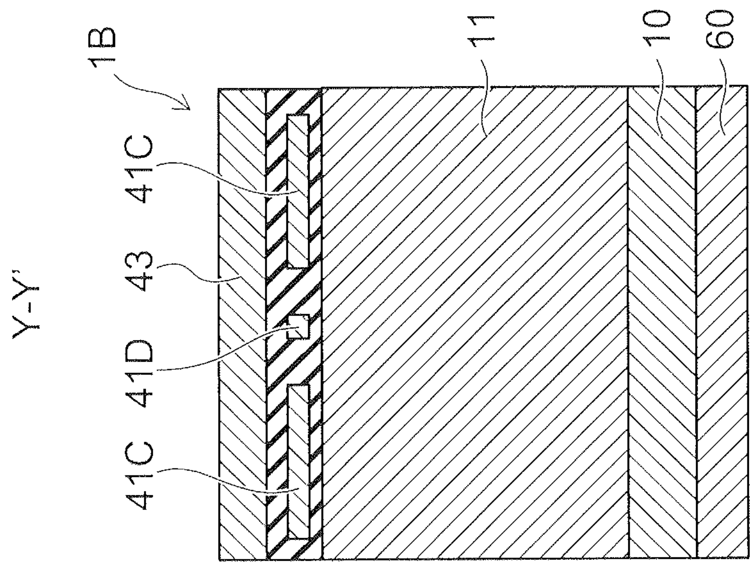
FIG. 7B is a cross-sectional view taken along Y-Y' of FIG. 6.
Figure 7A:
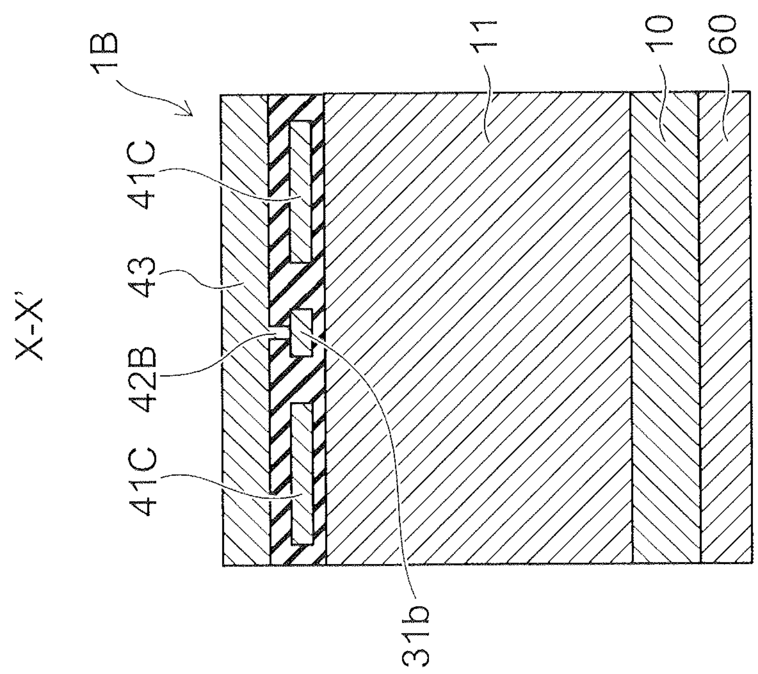
FIG. 7A is a cross-sectional view taken along X-X' of FIG. 6.

FIG. 7 is a cross-sectional view of the major part of the semiconductor device according to the first variation of the first specific example, in which FIG. 7A is a cross-sectional view taken along X-X' of FIG. 6, and FIG. 7B is a cross-sectional view taken along Y-Y' of FIG. 6.

In the semiconductor device 1B according to the first variation of the first specific example, the gate electrode 41 includes a third gate electrode 41C and a second the gate electrode 41D. When viewed from a direction perpendicular to the major surface of the $n^+$-type drain layer 10, the planar shape of the third gate electrode 41C is rectangular. However, the linear and thin second gate electrode 41D enters from an edge of the third gate electrode 41C toward the central part thereof. The third gate electrode 41C is shaped such that a part of the third gate electrode 41C is divided by the second gate electrode 41D.

In the semiconductor device 1B, a part of the gate electrode 41 is narrowed. For example, in a direction along which the first gate electrodes 31 are arranged periodically, the width of the second gate electrode 41D is smaller than the width of the third gate electrode 41C. The width of the third gate electrode 41C may be either the width of the third gate electrode 41C which has been divided, or the width of the third gate electrode 41C which has not been divided. Because of this, the electrical resistance of the second gate electrode 41D becomes higher than the electrical resistance of the third gate electrode 41C.

In the semiconductor device 1B, the gate pad electrode 43 is connected to a joint 31*b* of the first gate electrode 31, via the contact layer 42B. The contact layer 42B is positioned near the center of the two corners of the gate pad region 91. The joint 31*b* is a part of the first gate electrode 31. In addition, the gate pad electrode 43 is connected to the second gate electrode 41D, via the contact layer 42B. The second gate electrode 41D is connected to the third gate electrode 41C.

In the semiconductor device 1B, the gate electrode 41 is provided under the gate pad electrode 43, besides the first gate electrode 31. The second gate insulating film 40 is provided between the gate electrode 41 and the drain electrode 60. The p-type base layer 12 is not provided on the surface of the n-type drift layer 11 of the gate pad region 91, but the p-type base layer 12 is selectively provided on the surface of the n-type drift layer 11 of the device region 90.

Therefore, in the semiconductor device 1B, the gate-drain capacitance (Cgd') is generated between the gate pad electrode 43 and the drain electrode 60, besides the gate-drain capacitance (Cgd).

The gate pad electrode 43 and the gate electrode 41 do not contact each other in the entire region in which they face each other, but are electrically connected via the contact layer 42B provided in a part of the gate pad region 91. In addition, the gate electrode 41 includes the thin second gate electrode 41D. Because of this, a high internal gate resistance rg is generated n the gate electrode 41.

Therefore, the time constant between the gate and the drain of the semiconductor device 1B becomes larger than in the case of the semiconductor device 100. As a result, switching noise of the semiconductor device 1B is suppressed in comparison with the case of the semiconductor device 100.

Second Variation of First Specific Example

Figure 8:
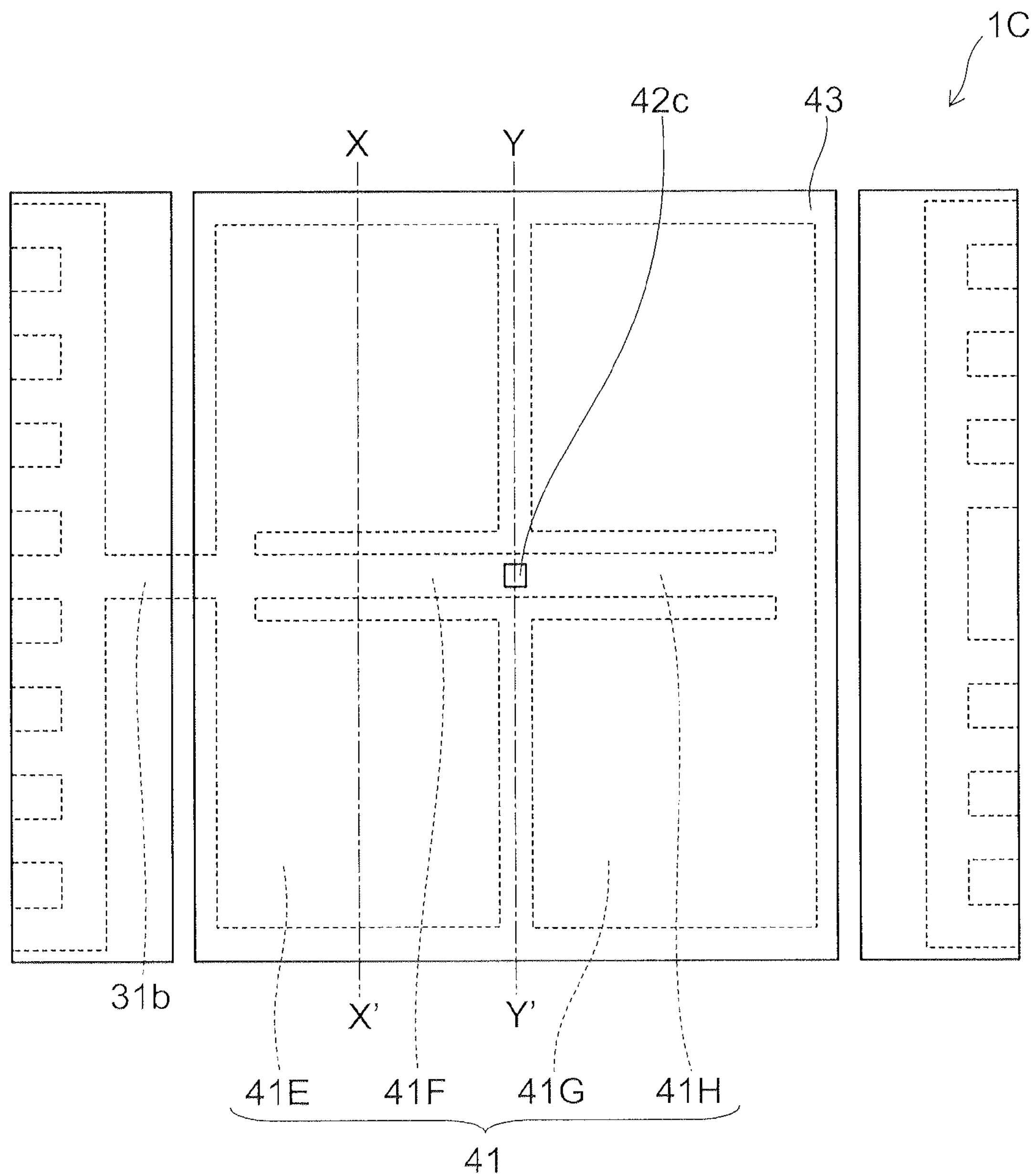
FIG. 8 is a plan view of the major part of a semiconductor device according to the second variation of the first specific example.

FIG. 8 is a plan view of the major part of the semiconductor device according to the second variation of the first specific example.

Figure 9B:
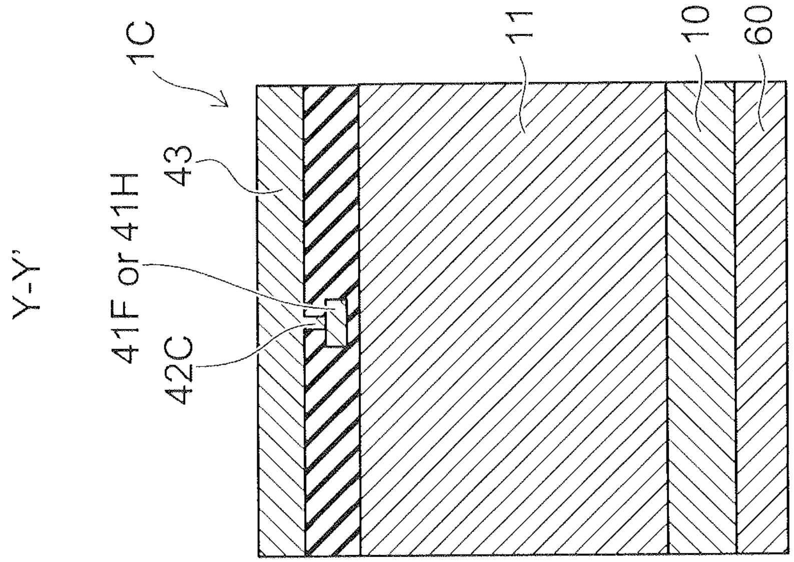
FIG. 9B is a cross-sectional view taken along Y-Y' of FIG. 8.
Figure 9A:
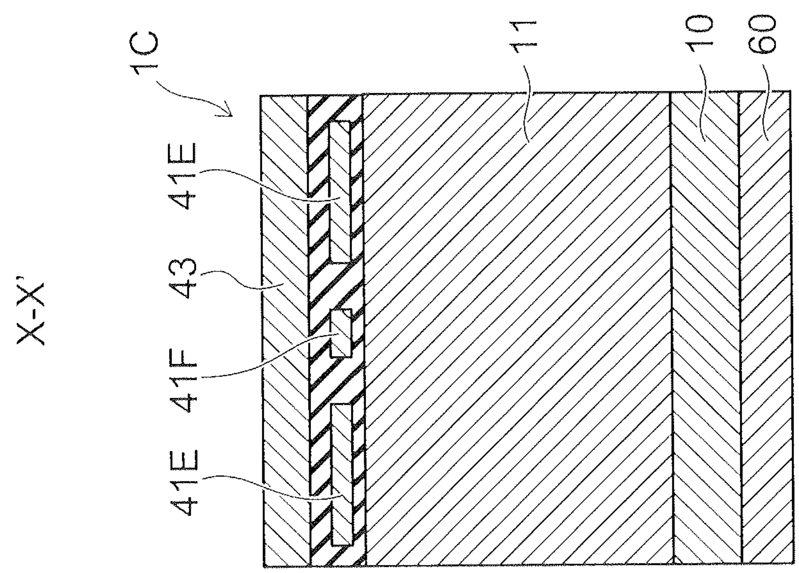
FIG. 9A is a cross-sectional view taken along X-X' of FIG. 8.

FIG. 9 is a cross-sectional view of the major part of the semiconductor device according to the second variation of the first specific example, in which FIG. 9A is a cross-sectional view taken along X-X' of FIG. 8, and FIG. 9B is a cross-sectional view taken along Y-Y' of FIG. 8.

In the semiconductor device 1C according to the second variation of the first specific example, the gate electrode 41 includes the third gate electrode 41E, the second gate electrode 41F, the third gate electrode 41G, and the second gate electrode 41H. When viewed from a direction perpendicular to the major surface of the $n^+$-type drain layer 10, the planar shape of the third gate electrodes 41E and 41G is rectangular.

However, the linear and thin second gate electrode 41F enters from an edge of the third gate electrode 41E toward the central part thereof. The third gate electrode 41E has a shape such that a part of the third gate electrode 41E is divided by the second gate electrode 41F. Furthermore, the linear and thin second gate electrode 41H enters from an edge of the third gate electrode 41G toward the central part thereof. The third gate electrode 41G has a shape such that a part of the third gate electrode 41G is divided by the second gate electrode 41H.

In the semiconductor device 1C, a part of the gate electrode 41 is narrowed. For example, in a direction along which the first gate electrodes 31 are arranged periodically, the width of the second gate electrodes 41F and 41H is smaller than the width of the third gate electrodes 41E and 41G. The width of the third gate electrodes 41E and 41G is the width of the third gate electrodes 41E and 41G which have been divided. Because of this, the electrical resistance of the second gate electrodes 41F and 41H becomes higher than the electrical resistance of the third gate electrodes 41E and 41G.

In the semiconductor device 1C, the gate pad electrode 43 is connected to the second gate electrode 41F and the second gate electrode 41H, via the contact layer 42C. The contact layer 42C is positioned near the center of the gate pad region 91. The second gate electrode 41F is connected to the third gate electrode 41E. The second gate electrode 41H is connected to the third gate electrode 41G. The third gate electrode 41E is connected to the joint 31*b* which is a part of the first gate electrode 31. Such a structure also exerts the same effect as in the case of the semiconductor device 1B.

Third Variation of First Specific Example

Figure 10:
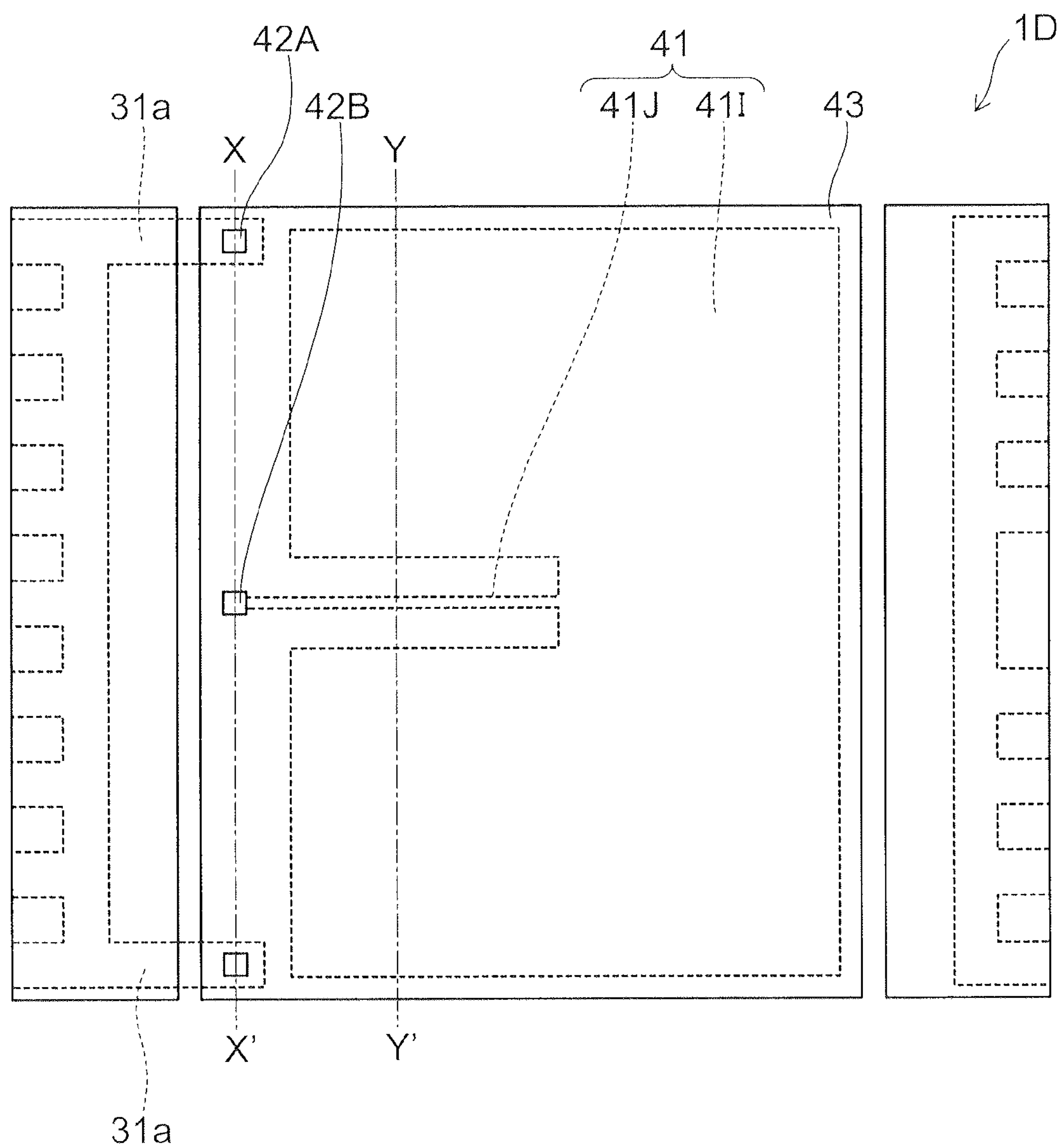
FIG. 10 is a plan view of the major part of a semiconductor device according to the third variation of the first specific example.

FIG. 10 is a plan view of the major part of the semiconductor device according to the third variation of the first specific example.

Figure 11B:
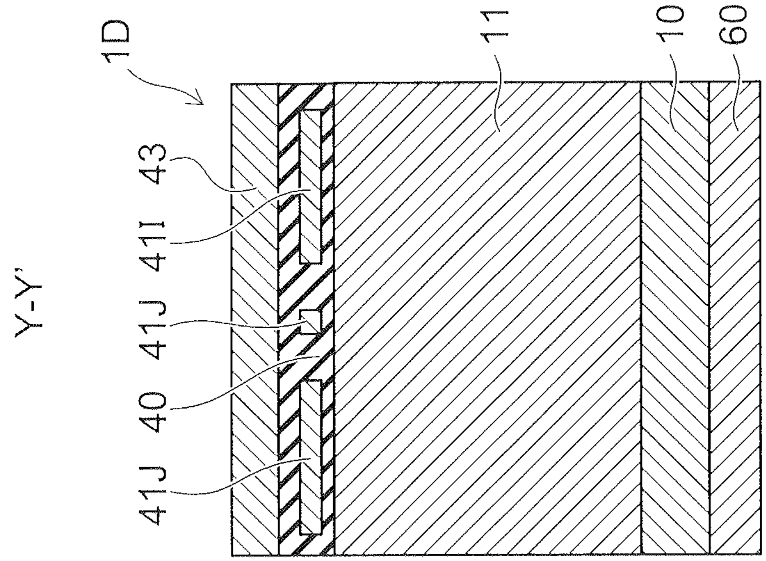
FIG. 11B is a cross-sectional view taken along Y-Y' of FIG. 10.
Figure 11A:
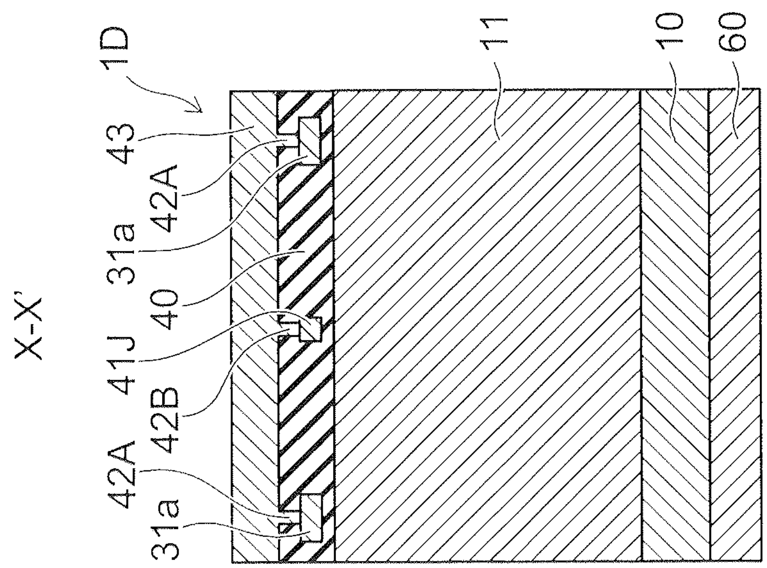
FIG. 11A is a cross-sectional view taken along X-X' of FIG. 10

FIG. 11 is a cross-sectional view of the major part of the semiconductor device according to the third variation of the first specific example, in which FIG. 11A is a cross-sectional view taken along X-X' of FIG. 10 and FIG. 11B is a cross-sectional view taken along Y-Y' of FIG. 10.

In the semiconductor device 1D according to the third variation of the first specific example, the gate electrode 41 includes the third gate electrode 41I and the second gate electrode 41J. When viewed from a direction perpendicular to the major surface of the $n^+$-type drain layer 10, the planar shape of the third gate electrode 41I is rectangular. However, the linear and thin second gate electrode 41J has entered from an edge of the third gate electrode 41I toward the central part. The third gate electrode 41I is shaped such that a part of the third gate electrode 41I is divided by the second gate electrode 41J.

In the semiconductor device 1D, a part of the gate electrode 41 is narrowed. For example, in a direction along which the first gate electrodes 31 are arranged periodically, the width of the second gate electrode 41J is smaller than the width of the third gate electrode 41I. The width of the third gate electrode 41I may be either the width of the third gate electrode 41I which has been divided, or the width of the third gate electrode 41I which has not been divided. Because of this, the electrical resistance of the second gate electrode 41J becomes higher than the electrical resistance of the third gate electrode 41I.

In the semiconductor device 1D, the gate pad electrode 43 is connected to the joint 31*a* which is a part of the first gate electrode 31, via the contact layer 42A. In addition, the gate pad electrode 43 is connected to the second gate electrode 41J, via the contact layer 42B. The second gate electrode 41J is connected to the third gate electrode 41I.

In this way, the semiconductor device 1D is provided with a first part (contact layer 42A) connecting the gate pad electrode 43 which is an extraction electrode and the first gate electrode 31, and a second part (contact layer 42B) connecting the gate pad electrode 43 which is an extraction electrode and the gate electrode 41.

Also in such a structure, the gate-drain capacitance (Cgd') is generated between the gate pad electrode 43 and the drain electrode 60, besides the gate-drain capacitance (Cgd).

The gate pad electrode 43 and the gate electrode 41 do not contact each other in the entire region in which they face each other, but are electrically connected via the contact layer 42B provided in a part of the gate pad region 91. In addition, the gate electrode 41 includes the thin second gate electrode 41J. Accordingly, a high internal gate resistance rg is generated in the gate electrode 41.

Therefore, the time constant between the gate and the drain of the semiconductor device 1D becomes larger than in the case of the semiconductor device 100. As a result, switching noise of the semiconductor device 1D is suppressed in comparison with the case of the semiconductor device 100.

Fourth Variation of First Specific Example

Figure 12:
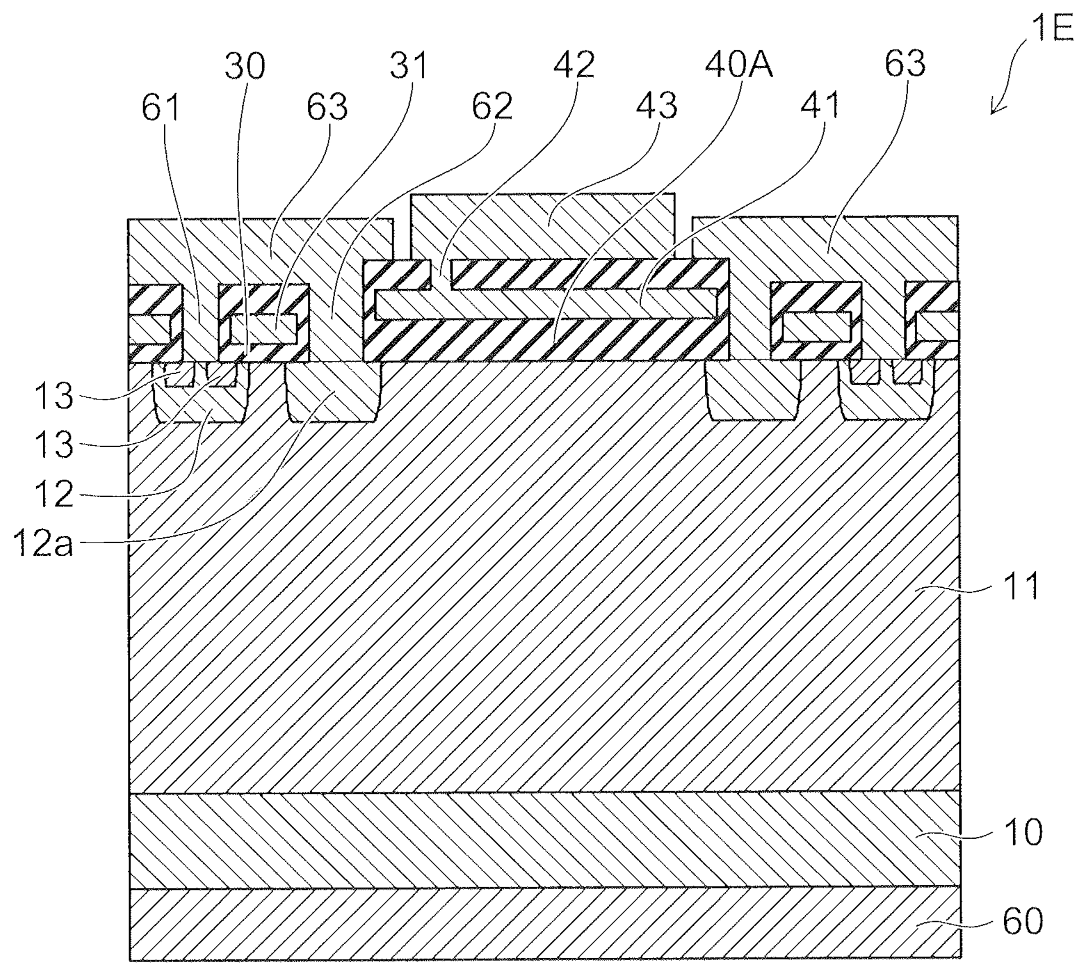
FIG. 12 is a cross-sectional view of the major part of a semiconductor device according to the fourth variation of the first specific example.

FIG. 12 is a cross-sectional view of the major part of the semiconductor device according to the fourth variation of the first specific example.

In the semiconductor device 1E according to the fourth variation of the first specific example, the thickness of the second gate insulating film 40A under the gate electrode 41 is larger than the thickness of the first gate insulating film 30 under the first gate electrode 31.

According to such a structure, avalanche breakdown under the gate pad electrode 43 becomes difficult to be generated when applying a high voltage between the drain and the source. That is, the decrease in breakdown voltage and the decrease in avalanche resistance are suppressed in the semiconductor device 1E.

Second Specific Example

Figure 13:
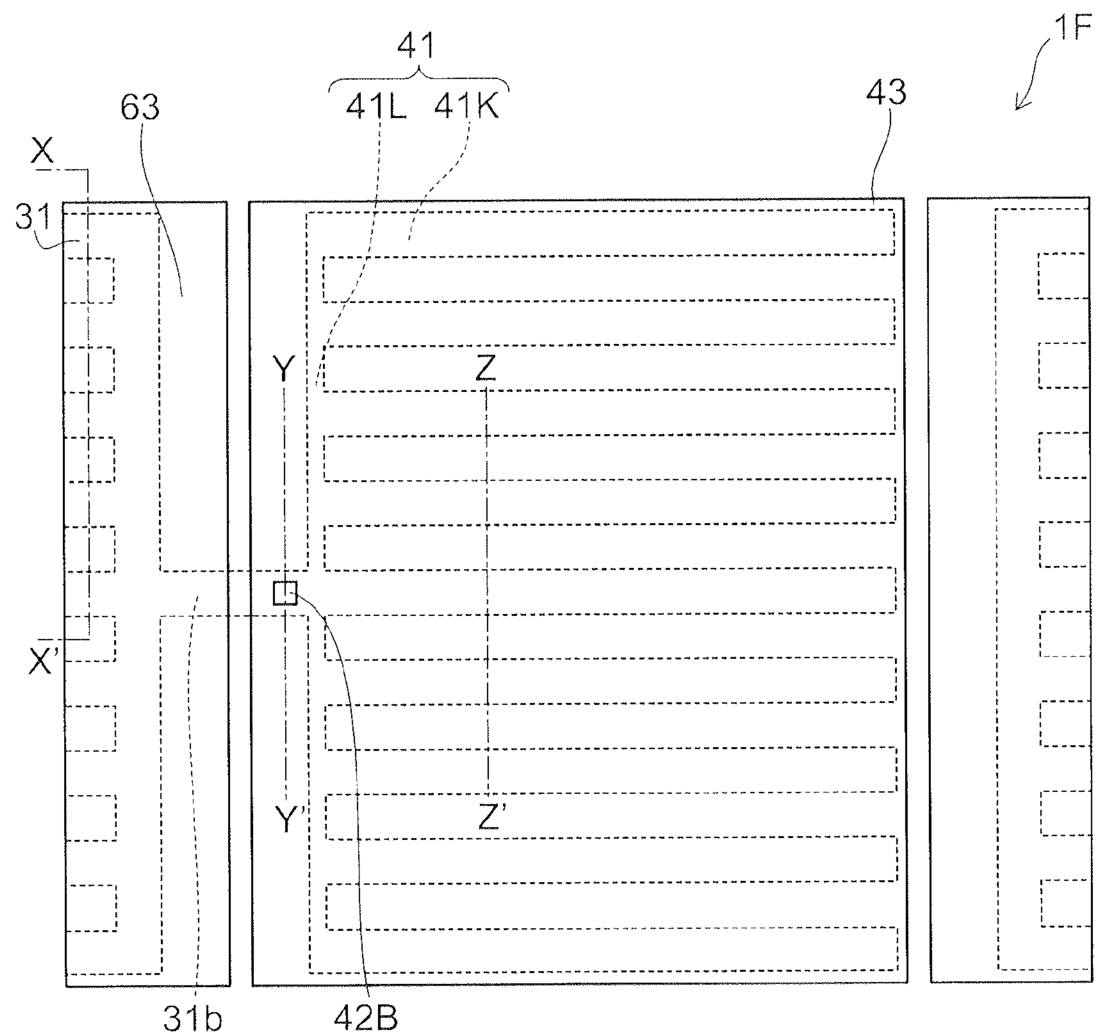
FIG. 13 is a plan view of the major part of a semiconductor device according to the second specific example.

FIG. 13 is a plan view of the major part of the semiconductor device according to the second specific example.

Figures 14A, 14B, 14C:
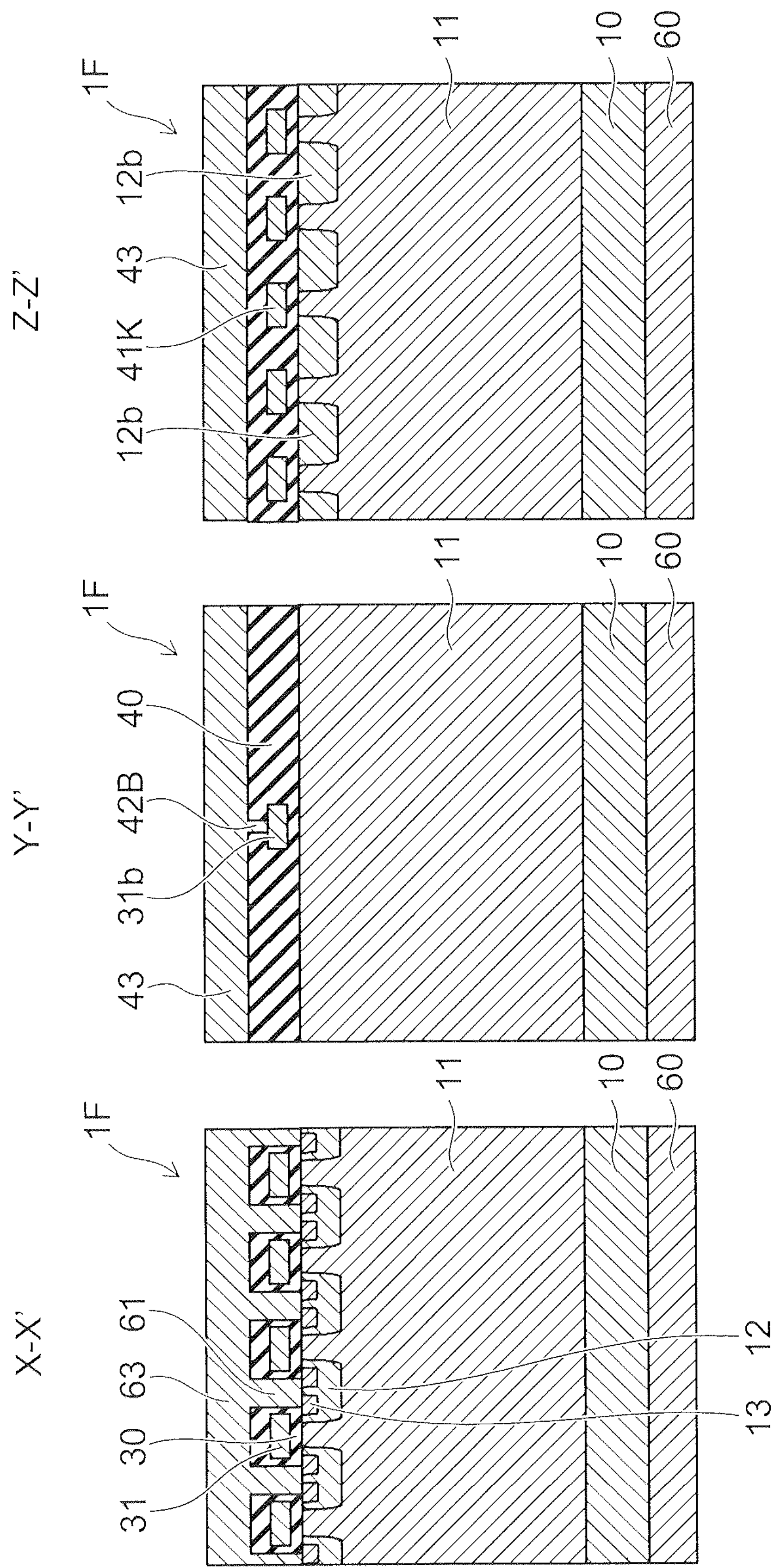
FIG. 14A is a cross-sectional view taken along X-X' of FIG. 13.
FIG. 14B is a cross-sectional view taken along Y-Y' of FIG. 13.
FIG. 14C is a cross-sectional view taken along Z-Z' of FIG. 13.

FIG. 14 is a cross-sectional view of the major part of the semiconductor device according to the second specific example, in which FIG. 14A is a cross-sectional view taken along X-X' of FIG. 13, FIG. 14B is a cross-sectional view taken along Y-Y' of FIG. 13, and FIG. 14C is a cross-sectional view taken along Z-Z' of FIG. 13.

In the semiconductor device 1F according to the second specific example, the gate electrode 41 includes the third gate electrode 41K and the second gate electrode 41L. When viewed from a direction perpendicular to the major surface of the $n^+$-type drain layer 10, the gate electrode 41 is comb-shaped. That is, the pattern formed by the third gate electrode 41K and the second gate electrode 41L is comb-shaped. A plurality of linear third gate electrodes 41K are connected to the linear and thin second gate electrode 41L. The second gate electrode 41L and the third gate electrodes 41K are approximately perpendicular to each other. The third gate electrodes 41K are arranged periodically in a direction along which the second gate electrode 41L extends.

In the semiconductor device 1F, a part of the gate electrode 41 is narrowed. For example, the width of the second gate electrode 41L in a direction approximately perpendicular to the direction along which the first gate electrodes 31 are arranged periodically is smaller than the width of the third gate electrode 41K in a direction along which the first gate electrodes 31 are arranged periodically. Accordingly, the electrical resistance of the second gate electrode 41L becomes higher than the electrical resistance of the third gate electrode 41K.

In the semiconductor device 1F, the gate pad electrode 43 is connected to the joint 31*b* which is a part of the first gate electrode 31, via the contact layer 42B. In addition, the joint 31*b* is connected to the second gate electrode 41L.

Also in such a structure, the gate-drain capacitance (Cgd') is generated between the gate pad electrode 43 and the drain electrode 60, besides the gate-drain capacitance (Cgd).

The gate pad electrode 43 and the gate electrode 41 are electrically connected via the contact layer 42B provided in a part of the gate pad region 91. In addition, the gate electrode 41 includes the thin second gate electrode 41L. Because of this, a high internal gate resistance rg is generated in the gate electrode 41.

In the semiconductor device 1F, the gate electrode 41 is formed in a comb-shaped manner rather than in a planar-shaped manner, when viewed from a direction perpendicular to the major surface of the $n^+$-type drain layer 10. In this way, the size of the gate-drain capacitance (Cgd') can be adjusted as appropriate by changing the pattern of the gate electrode 41 from a planar pattern to a linear pattern.

Therefore, the time constant between the gate and the drain of the semiconductor device 1F becomes larger than in the case of the semiconductor device 100. As a result, switching noise of the semiconductor device 1F is suppressed in comparison with the case of the semiconductor device 100.

In the semiconductor device 1F, a p-type guard ring layer 12*b* is selectively provided on the surface of the n-type drift layer 11 between the adjacent third gate electrodes 41K. The p-type guard ring layer 12*b* is formed in the same manufacturing process as the p-type base layer 12. That is, the p-type guard ring layer 12*b* is formed simultaneously with the p-type base layer 12.

Electric field concentration to the gate electrode 41 is suppressed by providing the p-type guard ring layer 12*b*, and the decrease in breakdown voltage under the gate pad electrode 43 is suppressed. Because of this, the decrease in avalanche resistance is suppressed in the semiconductor device 1F.

First Variation of Second Specific Example

Figures 15A, 15B, 15C:
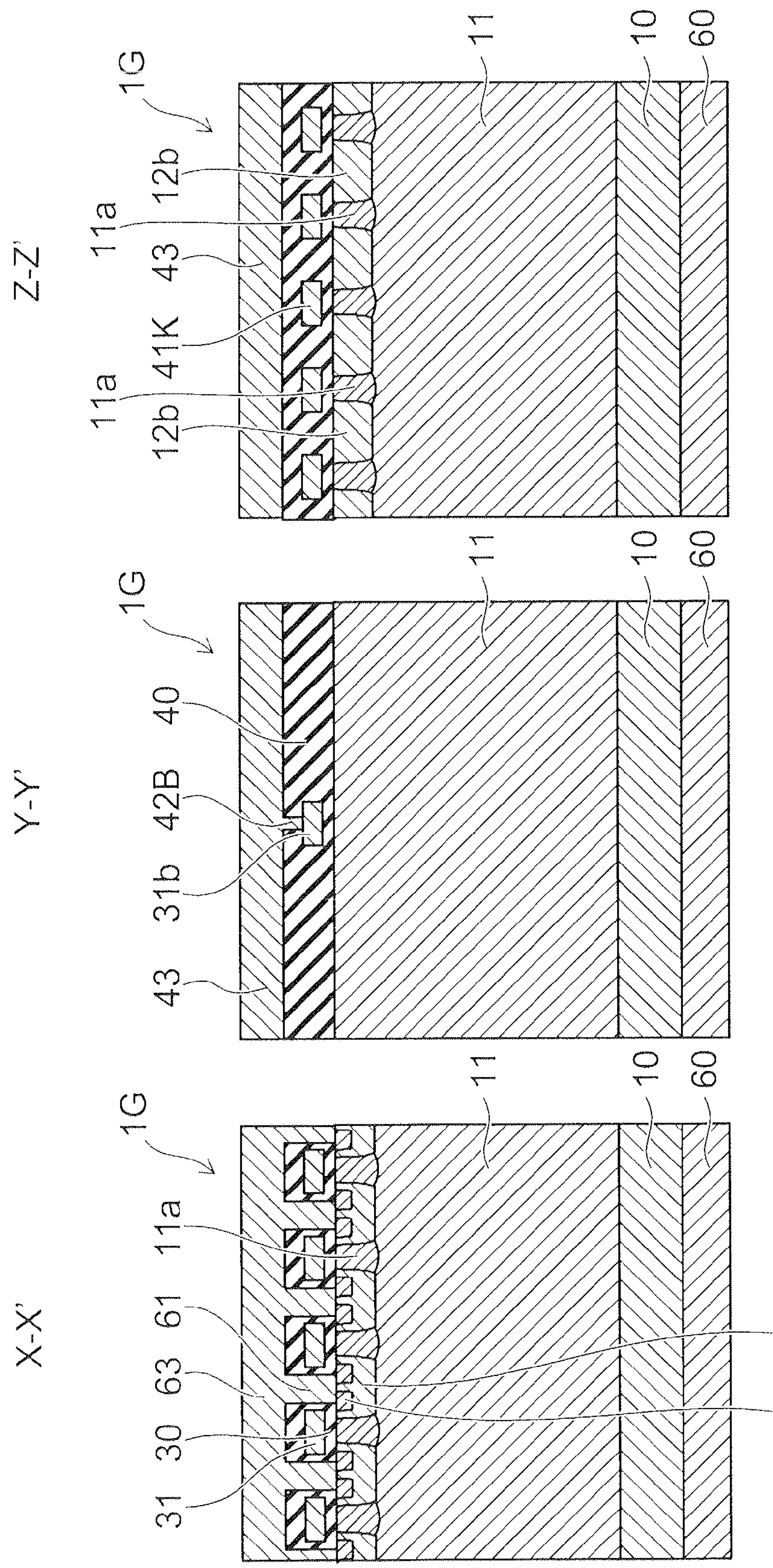
FIGS. 15A-15C are cross-sectional views of the major part of a semiconductor device according to the first variation of the second specific example.

FIGS. 15A-15C are cross-sectional views of the major part of the semiconductor device according to the first variation of the second specific example. FIG. 15A corresponds to the cross-section taken along X-X' of FIG. 13, FIG. 15B corresponds to the cross-section taken along Y-Y' of FIG. 13, and FIG. 15C corresponds to the cross-sectional view taken along Z-Z' of FIG. 13.

In the semiconductor device 1G according to the first variation of the second specific example, a high concentration N-type layer 11*a* serving as the fifth semiconductor layer is selectively provided on the surface of the n-type drift layer 11 between the adjacent p-type base layers 12 and between the adjacent p-type guard rings 12*b*. The impurity concentration of the high concentration N-type layer 11*a* is higher than the impurity concentration of the n-type drift layer 11.

Due to the disposition of the high concentration N-type layer 11*a*, the ON-resistance in the device region 90 is reduced. Furthermore, charging effect on the high concentration N-type layer 11*a* rises, and thus the gate-drain capacitance (Cgd') under the gate pad electrode 43 can be further increased.

Second Variation of Second Specific Example

Figure 16:
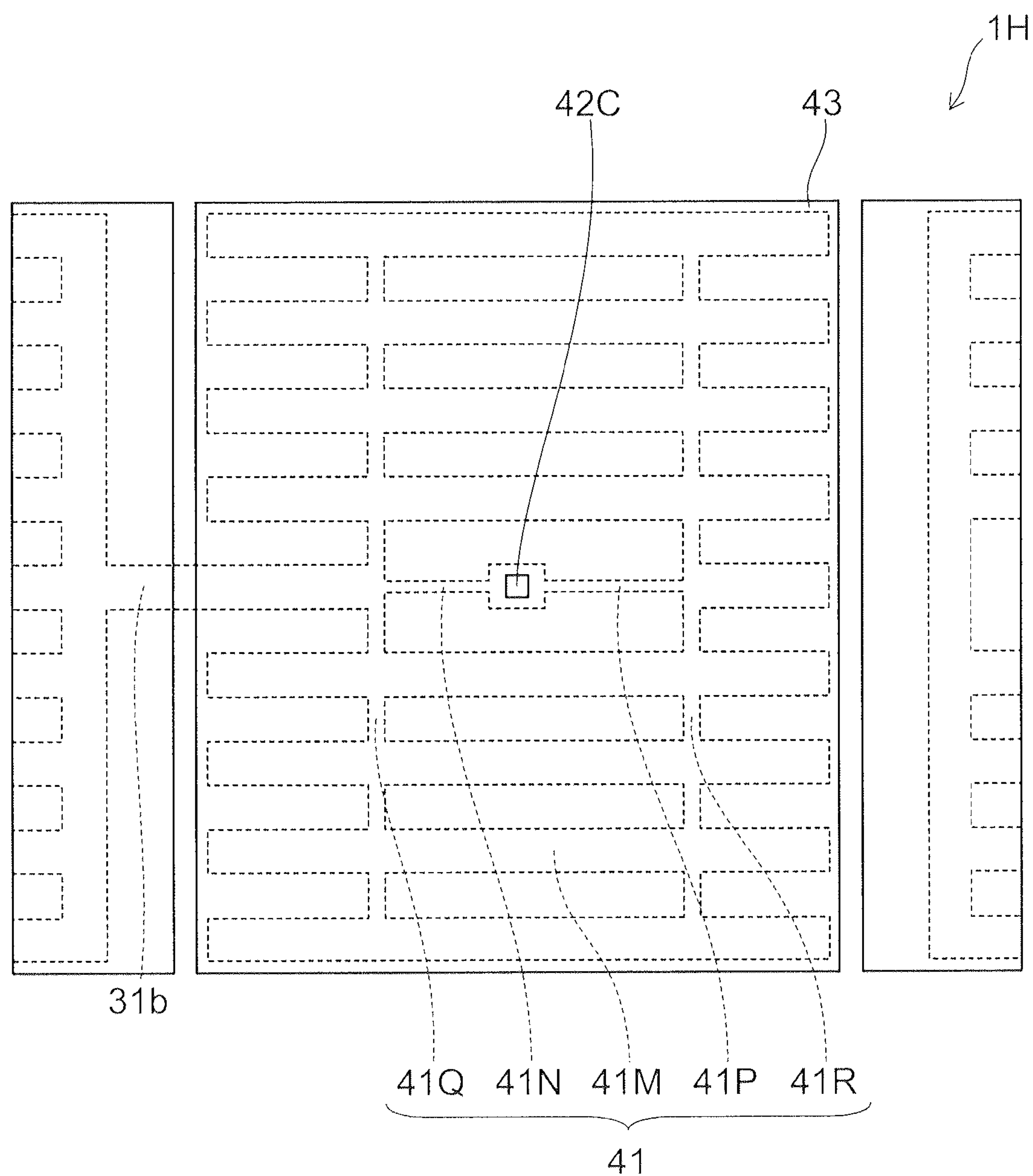
FIG. 16 is a plan view of the major part of a semiconductor device according to the second variation of the second specific example.

FIG. 16 is a plan view of the major part of the semiconductor device according to the second variation of the second specific example.

In the semiconductor device 1H according to the second variation of the second specific example, the gate electrode 41 includes a third gate electrode 41M, a second gate electrode 41N, a second gate electrode 41P, a second gate electrode 41R, and a second gate electrode 41Q. When viewed from a direction perpendicular to the major surface of the $n^+$-type drain layer 10, the gate electrode 41 is lattice-shaped.

That is, a plurality of linear third gate electrodes 41M are connected to the linear and thin second gate electrodes 41Q and 41R. The third gate electrodes 41M are approximately perpendicular to the second gate electrodes 41Q and 41R. The third gate electrodes 41M are arranged periodically in a direction along which the second gate electrodes 41Q and 41R extend. The second gate electrodes 41Q and 41R are respectively arranged approximately parallel to each other.

In the semiconductor device 1H, a part of gate electrode part 41 is narrowed. For example, in a direction along which the first gate electrodes 31 are arranged periodically, the width of the second gate electrodes 41N and 41P is smaller than the width of the third gate electrodes 41M. Because of this, the electrical resistance of the second gate electrodes 41N and 41P becomes higher than the electrical resistance of the third gate electrodes 41M.

In the semiconductor device 1H, the gate pad electrode 43 is connected to the second gate electrode 41N and the second gate electrode 41P, via the contact layer 42C. The second gate electrode 41N is connected to the second gate electrode 41Q. The second gate electrode 41P is connected to the second gate electrode 41R. The second gate electrode 41Q is connected to the joint 31*b* which is a part of the first gate electrode 31.

In the semiconductor device 1H, the p-type guard ring layer 12*b* may be selectively provided on the surface of the n-type drift layer 11 between the adjacent third gate electrodes 41M, like in the case of the semiconductor device 1F.

Also in such a structure, the gate-drain capacitance (Cgd') is generated between the gate pad electrode 43 and the drain electrode 60, besides the gate-drain capacitance (Cgd). Additionally, in the gate electrode 41, a high internal gate resistance is generated. Therefore, in the semiconductor device 1H, the same effect as in the case of the semiconductor device 1F is exerted.

Third Variation of Second Specific Example

Figure 17A:
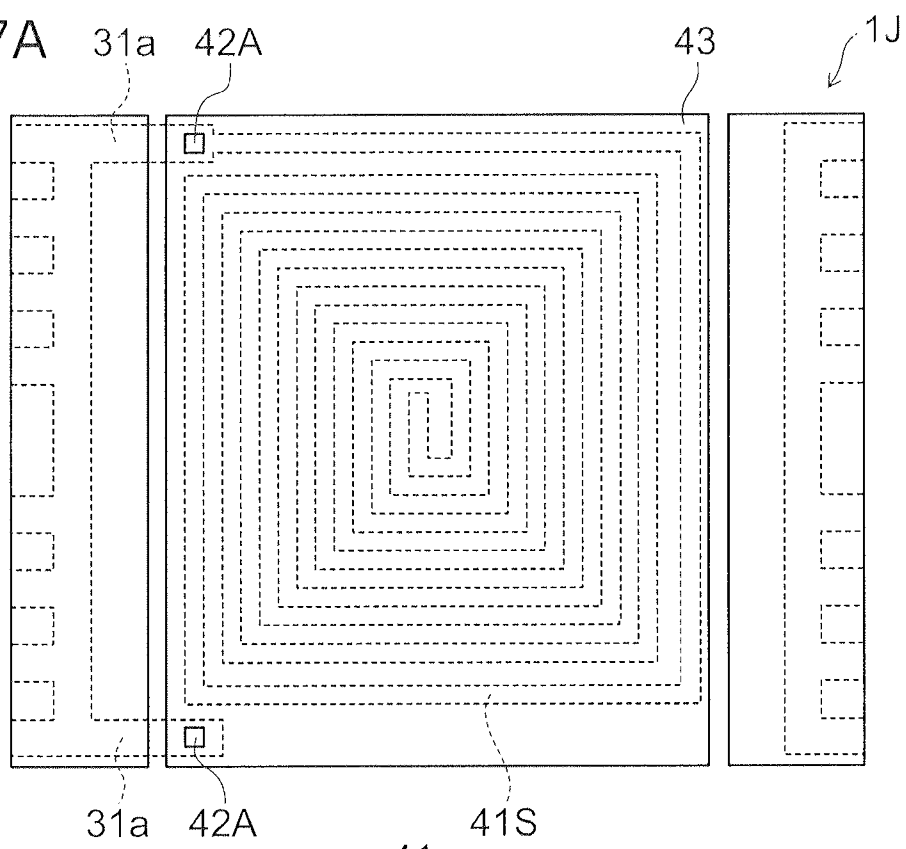
FIG. 17A and FIG. 17B are a plan view of the major part of a semiconductor device according to the third variation of the second specific example.

FIG. 17A and FIG. 17A are a plan view of the major part of the semiconductor device according to the third variation of the second specific example.

In the semiconductor device 1J according to the third variation of the second specific example shown in FIG. 17A, the gate electrode 41 includes a third gate electrode 41S. When viewed from a direction perpendicular to the major surface of the $n^+$-type drain layer 10, the gate electrode 41 is spiral.

That is, the linear and thin third gate electrode 41S forms a spiral so as to follow the circumference of the rectangular gate pad electrode 43.

In the semiconductor device 1J, the gate pad electrode 43 is connected to the joint 31*a* which is a part of the first gate electrode 31, via the contact layer 42A. In addition, the gate pad electrode 43 is connected to the third gate electrode 41S, via the contact layer 42A.

Also in such a structure, the gate-drain capacitance (Cgd') is generated between the gate pad electrode 43 and the drain electrode 60, besides the gate-drain capacitance (Cgd). In addition, a high internal gate resistance is generated in the gate electrode 41 by forming the gate electrode 41 in a spiral manner. In the semiconductor device 1J, the p-type guard ring layer 12*b* may be selectively provided on the surface of the n-type drift layer 11 between the adjacent third gate electrodes 41S, like in the case of the semiconductor device 1F. Therefore, in the semiconductor device 1J, the same effect as in the case of the semiconductor device 1F is exerted.

Figure 17B:
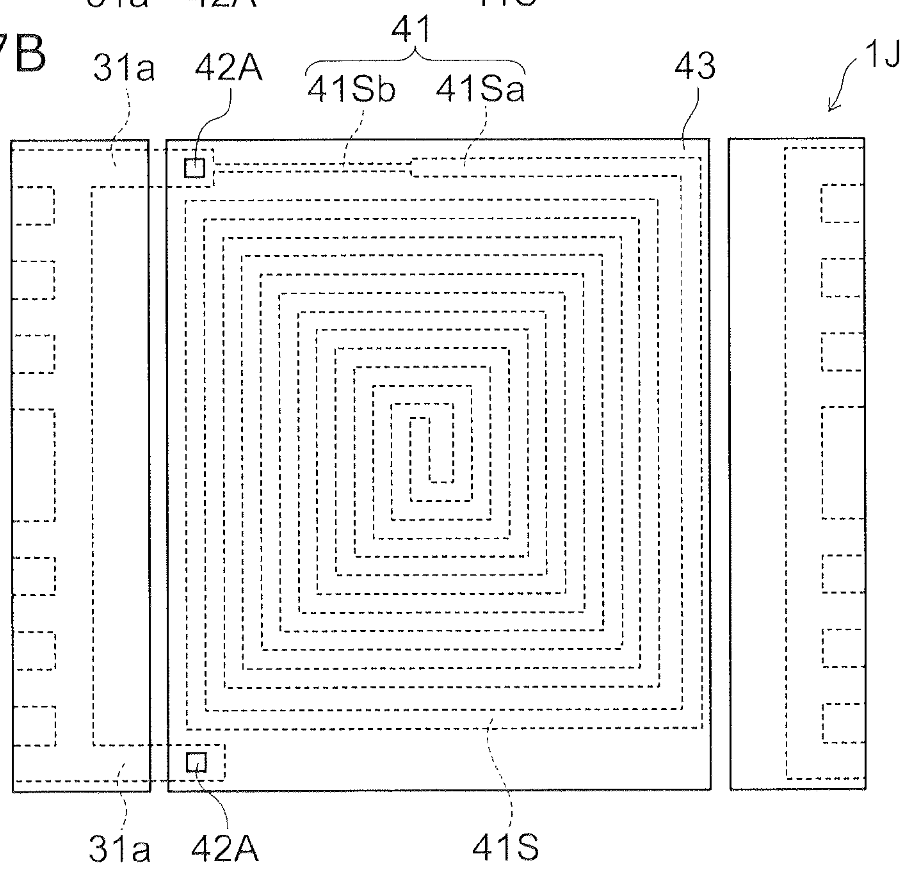

In addition, as shown in FIG. 17B, the gate electrode 41 may be configured to include the third gate electrode 41Sa and the second gate electrode 41Sb. The line width of the second gate electrode 41Sb is smaller than the line width of the third gate electrode 41Sa. Because of this, the electrical resistance of the second gate electrode 41Sb becomes higher than the electrical resistance of the third gate electrode 41Sa. Owing to such a structure, the internal gate resistance in the gate electrode 41 further increases.

In the embodiment, a super junction structure may be provided in the semiconductor layer. A semiconductor device having a super junction structure will be explained below, referring to a schematic drawing.

Third Specific Example

Figure 18:
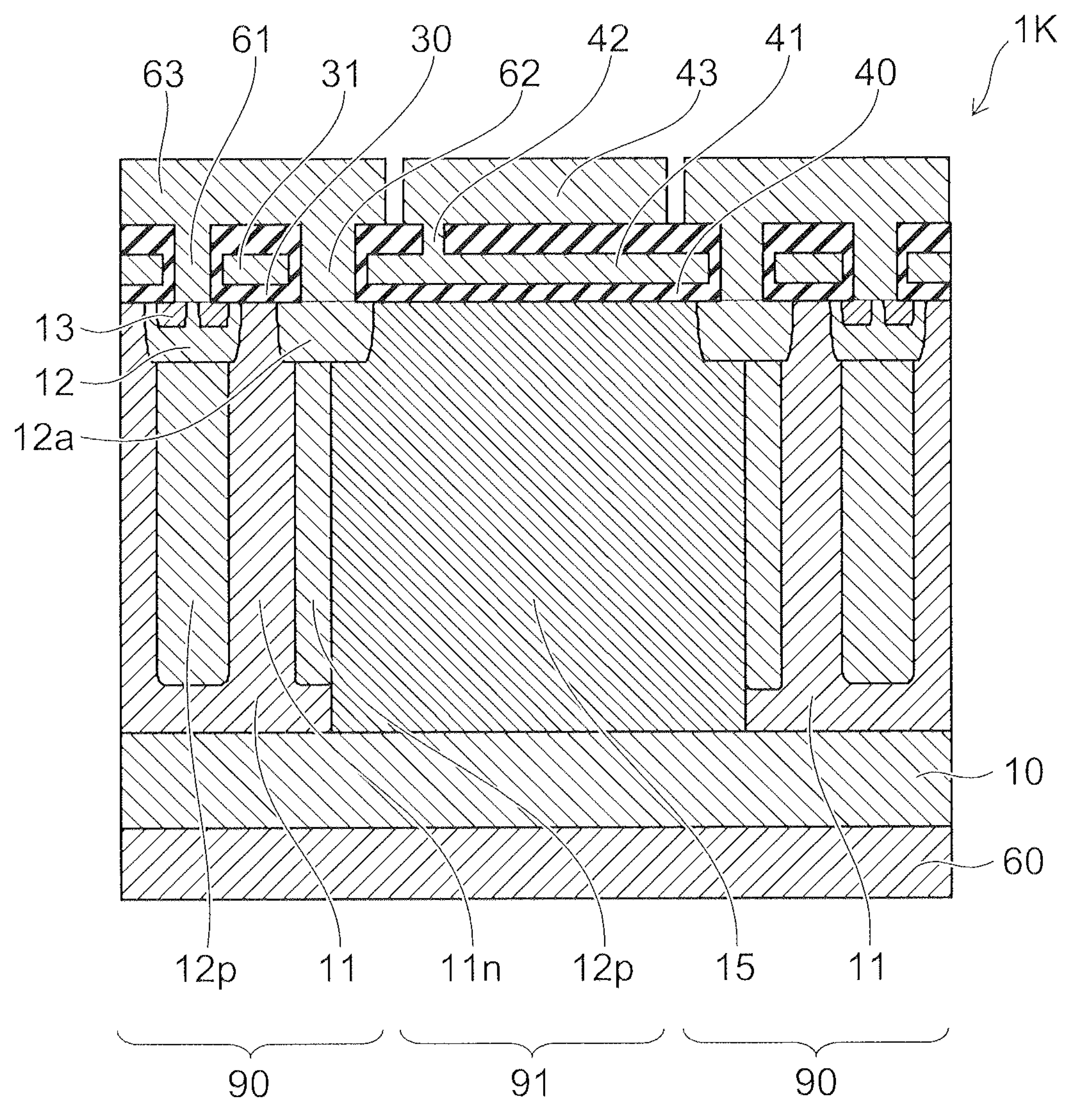
FIG. 18 is a cross-sectional view of the major part of a semiconductor device according to the third specific example.

FIG. 18 is a cross-sectional view of the major part of the semiconductor device according to a third specific example.

In the semiconductor device 1K according to the third specific example, the n-type drift layer 11 is provided on the $n^+$-type drain layer 10 in the device region 90.

In the device region 90, the p-type base layer 12 is selectively provided on the surface of the n-type drift layer 11. The $n^+$-type source layer 13 is selectively provided on the surface of the p-type base layer 12. Around the outermost circumference of the device region 90, the $p^-$-type layer 12*a* is provided on the surface of the n-type drift layer 11. Inside the n-type drift layer 11, a p-type pillar layer 12*p* serving as the sixth semiconductor layer connected to the p-type base layer 12 is provided periodically in a direction approximately parallel to the major surface of the $n^+$-type drain layer 10.

That is, in the device region 90, a super junction structure including the p-type pillar layer 12*p* and the n-type pillar layer 11*n* is formed in the n-type drift layer 11. The n-type pillar layers 11*n* and the p-type pillar layers 12*p* are alternately arranged in a direction approximately parallel to the major surface of the $n^+$-type drain layer 10. The upper end of the p-type pillar layer 12*p* is connected to the p-type base layer 12.

In the gate pad region 91, an n-type drift layer having a concentration lower than the n-type pillar layer 11*n* in the device region 90 is provided on the $n^+$-type drain layer 10. The low-concentration n-type drift layer is referred to as an "$n^-$-type layer 15" in the following. The p-type pillar layer 12*p* is not provided in the gate pad region 91, and the impurity concentration of the n-type drift layer in the gate pad region 91, i.e., the $n^-$-type layer 15 is lower than the impurity concentration of the n-type drift layer 11 in the device region 90. It is desirable that the impurity concentration of the $n^-$-type layer 15 is not more than 1/10 of the n-type pillar layer 11*n* (or the n-type drift layer 11). The $n^-$-type layer 15 is in contact with the second gate insulating film 40. In the gate pad region 91, the super junction structure is not formed.

According to such a structure, the impurity concentration in the n-type pillar layer 11*n* can be set higher than the impurity concentration in the n-type drift layer 11. Because of this, the ON-resistance of the semiconductor device 1K is further reduced.

However, in a top-and-bottom electrode-structured MOSFET having the super junction structure, the drain-source capacitance (Cds) becomes large due to joining between the n-type pillar layer 11*n* and the p-type pillar layer 12*p*. A larger drain-source capacitance means that the gate-drain capacitance is relatively small. Accordingly, it can be considered that switching noise is generated from such a MOSFET. For example, there are concerns that the control of the temporal variation of the drain-source voltage (dVds/dt) by internal gate resistance may become impossible (Vds: drain-source voltage).

However, in the semiconductor device 1K, the p-type base layer 12 and the super junction structure are not provided under the gate pad electrode 43. Because of this, the drain-source capacitance (Cds) is not generated under the gate pad electrode 43. That is, the semiconductor device 1K also has a high gate-drain capacitance. Accordingly, in the semiconductor device 1K, the temporal variation (dVds/dt) of the drain-source voltage (Vds) can be well controlled by the internal gate resistance. As a result, switching noise is reduced.

Furthermore, in the semiconductor device 1K, a low concentration $n^-$-type layer 15 is provided under the gate pad electrode 43. Therefore, when a high voltage source is applied between the drain and the source, the $n^-$-type layer 15 is easily depleted, thereby avalanche breakdown under the gate pad electrode 43 being suppressed. Because of this, the semiconductor device 1K maintains the high breakdown voltage. Meanwhile, the semiconductor device 1K maintains the high breakdown voltage even if a low concentration $p^-$-type layer is disposed in place of the $n^-$-type layer 15.

First Variation of Third Specific Example

Figure 19:
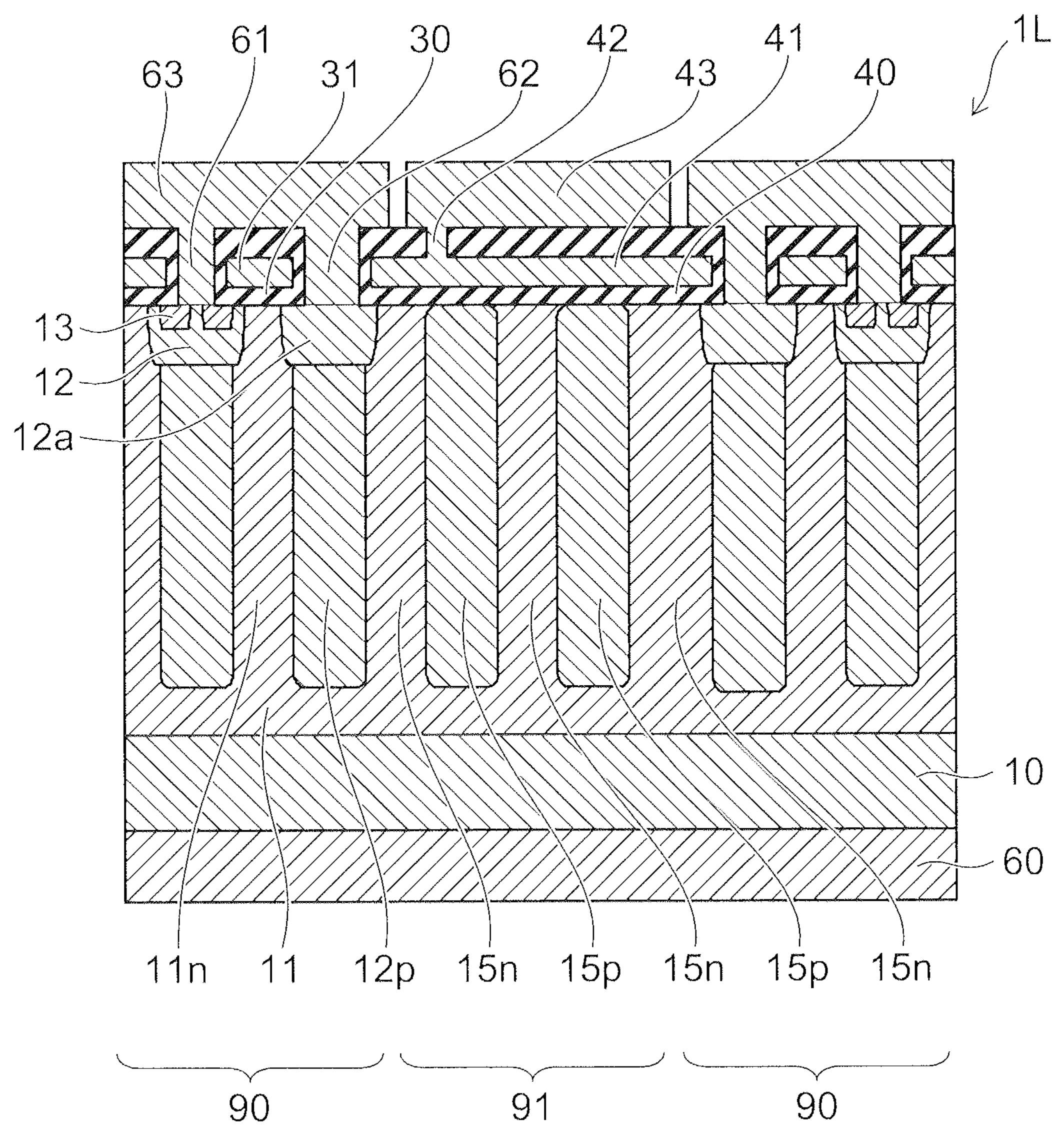
FIG. 19 is a cross-sectional view of the major part of a semiconductor device according to the first variation of the third specific example.

FIG. 19 is a cross-sectional view of the major part of the semiconductor device according to the first variation of the third specific example.

In the semiconductor device 1L according to the first variation of the third specific example, a super junction structure has been formed in the gate pad region 91, besides the device region 90. In the gate pad region 91, n-type pillar layers 15*n* and p-type pillar layers 15*p* are alternately arranged in a direction approximately parallel to the major surface of the $n^+$-type drain layer 10.

The impurity concentration in the n-type pillar layer 15*n* and the p-type pillar layer 15*p* in the gate pad region 91 is lower than the impurity concentration in of the n-type pillar layer 11*n* and the p-type pillar layer 12*p* in the device region 90. Because of this, the drain-source capacitance in the gate pad region 91 does not become larger. Furthermore, it is desirable not to connect the p-type pillar layer 15*p* to the p-type base layer 12 in order to suppress increase of the drain-source capacitance.

In addition, since the impurity concentration in the n-type pillar layer 15*n* and the p-type pillar layer 15*p* is low, super junction structure in the gate pad region 91 can be easily depleted. In this way, avalanche breakdown under the gate pad electrode 43 becomes difficult to be generated, because the super junction structure in the gate pad region 91 easily becomes depleted. As a result, the breakdown voltage of the semiconductor device 1L increases.

Second Variation of Third Specific Example

Figure 20:
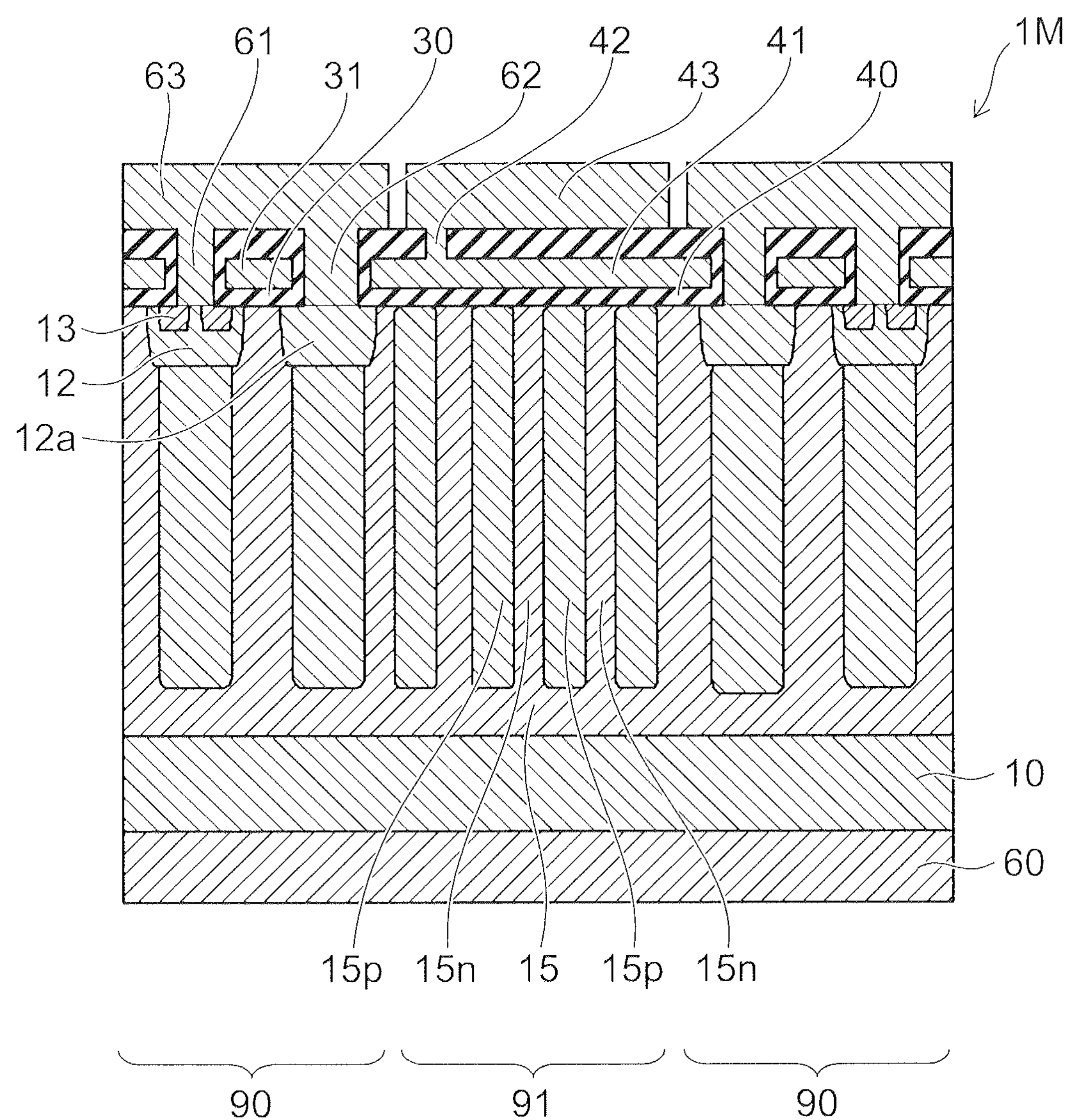
FIG. 20 is a cross-sectional view of the major part of a semiconductor device according to the second variation of the third specific example.

FIG. 20 is a cross-sectional view of the major part of the semiconductor device according to the second variation of the third specific example.

In the semiconductor device 1M according to the second variation of the third specific example, a super junction structure is formed in the gate pad region 91, besides the device region 90. In the gate pad region 91, the period with which the n-type pillar layers 15_n_ and p-type pillar layers 15_p_ are alternately arranged is shorter than the period with which the n-type pillar layers 11_n_ and the p-type pillar layers 12_p_ are alternately arranged in the device region 90.

Because of this, the super junction structure in the gate pad region 91 can be more easily depleted. Therefore, avalanche breakdown under the gate pad electrode 43 becomes difficult to be generated. As a result, the breakdown voltage of the semiconductor device 1M increases. Meanwhile, in order to further facilitate depletion of the super junction structure in the gate pad region 91, the impurity concentration in the n-type pillar layer 15_n_ and the p-type pillar layer 15_p_ in the gate pad region 91 may be set lower than the impurity concentration in the n-type pillar layer 11_n_ and the p-type pillar layer 12_p_ in the device region 90.

In super junction structure, the p-type pillar layer may be the sixth semiconductor layer. In addition, since an n-type pillar layer is formed between the p-type pillar layers as a result of having formed the p-type pillar layer in the n-type drift layer, the n-type pillar may be referred to as either the n-type drift layer or the second semiconductor layer.

Hereinabove, embodiments are not limited to these specific examples, and can be modified in a variety of ways without deviating from the purport of the embodiments.

For example, although the embodiments have been explained with the first conductivity type being the n-type and the second conductivity type being the p-type, the embodiments can also be implemented with the first conductivity type being the p-type and the second conductivity type being the n-type.

In addition, although the embodiments have been explained by using a planar-type gate structure, a similar effect can be obtained by applying a similar design to under the gate pad when a trench gate-type gate structure is employed.

In addition, although the plane pattern has not been described in particular, the embodiments are not limited to plane patterns of the MOS gate structure or the super junction structure, and any pattern such as striped, meshed, staggered, honeycombed pattern, or the like, will do.

The embodiments are not limited to the opening positions and the number of the gate contact holes, and can be implemented with a single position or 2 or more positions.

In addition, a uniform $p^+$ form layer may be provided between the $n^+$-type drain layer 10 and the n-type drift layer 11 so that the semiconductor device is used as an IGBT device. A part of the $p^+$ form layer may be selectively opened so that the semiconductor device is used as a reverse-conducting-type IGBT device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:

a semiconductor substrate of first conductivity type having a first face and a second face;

a first electrode provided on a side of the first face;

a first semiconductor layer of second conductivity type provided on a side of the second face of the semiconductor substrate;

a second semiconductor layer of first conductivity type selectively provided on the first semiconductor layer in a first region of the second face;

an insulating film provided on the second face;

a gate extraction pad provided above the insulating film in a second region of the second face, the second region being next to the first region;

a gate electrode provided on the first semiconductor layer and the second semiconductor layer via the insulating film in the first region, the gate electrode being positioned between the semiconductor substrate and the gate extraction pad in the second region, the insulating film being provided between the semiconductor substrate and the gate electrode; and a second electrode electrically connected to the first semiconductor layer and the second semiconductor layer in the first region.

2. The semiconductor device according to claim 1, wherein the gate extraction pad completely covers the second region of the second face.

3. The semiconductor device according to claim 1, wherein the insulating film is also provided between the gate extraction pad and the gate electrode in the second region.

4. The semiconductor device according to claim 3, wherein the gate extraction pad completely covers the second region of the second face.

* * * * *